United States Patent
Lee et al.

(10) Patent No.: US 12,520,483 B2
(45) Date of Patent: Jan. 6, 2026

(54) SEMICONDUCTOR DEVICE INCLUDING PAD PATTERN

(71) Applicant: SAMSUNG ELECTRONICS CO., LTD., Suwon-si (KR)

(72) Inventors: Jaepil Lee, Suwon-si (KR); Junbae Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 382 days.

(21) Appl. No.: 18/216,269

(22) Filed: Jun. 29, 2023

(65) Prior Publication Data

US 2024/0008265 A1    Jan. 4, 2024

(30) Foreign Application Priority Data

Jul. 1, 2022    (KR) ........................ 10-2022-0081374

(51) Int. Cl.
| | |
|---|---|
| *H10B 12/00* | (2023.01) |
| *H01F 17/00* | (2006.01) |
| *H01L 23/522* | (2006.01) |
| *H10D 1/20* | (2025.01) |
| *H10D 1/68* | (2025.01) |

(52) U.S. Cl.
CPC ....... *H10B 12/482* (2023.02); *H01F 17/0013* (2013.01); *H01L 23/5227* (2013.01); *H10B 12/315* (2023.02); *H10B 12/34* (2023.02); *H10B 12/50* (2023.02); *H10D 1/20* (2025.01); *H10D 1/716* (2025.01); *H01F 2017/0073* (2013.01)

(58) Field of Classification Search
CPC ...... H10B 12/00; H10B 12/34; H10B 12/482; H10B 12/05; H10B 12/30; H10B 12/315; H10B 12/48; H10B 12/50; H10B 12/03; H01L 23/522; H01L 23/5227; H01L 23/64; H01L 23/645; H01L 23/647; H01L 23/66; H10D 1/20; H10D 1/68; H10D 1/716; H01F 17/00; H01F 17/0006; H01F 17/0013; H01F 2017/0073
See application file for complete search history.

(56) References Cited

U.S. PATENT DOCUMENTS

| | | |
|---|---|---|
| 6,661,079 B1 | 12/2003 | Bikulcius |
| 7,202,152 B2 | 4/2007 | Davies |
| 7,544,580 B2 | 6/2009 | Shih |
| 8,492,822 B2 | 7/2013 | Lim et al. |
| 9,324,605 B2 | 4/2016 | Cho |
| 10,292,269 B1 * | 5/2019 | Mudakatte .......... H01L 23/5223 |

(Continued)

FOREIGN PATENT DOCUMENTS

| | | |
|---|---|---|
| KR | 10-2006-0077999 A | 7/2006 |
| KR | 10-0800919 B1 | 2/2008 |

*Primary Examiner* — Brook Kebede
(74) *Attorney, Agent, or Firm* — Sughrue Mion, PLLC

(57) ABSTRACT

A semiconductor device includes a lower structure, a data storage structure on the lower structure, and an inductor structure on the lower structure, where the data storage structure includes first electrodes extending in a vertical direction perpendicular to an upper surface of the lower structure, a second electrode provided on the first electrodes, and a dielectric layer between the first electrodes and the second electrode, and where the inductor structure includes an inductor conductive pattern at a level that is substantially the same as a level of the first electrodes.

20 Claims, 25 Drawing Sheets

(56) References Cited

U.S. PATENT DOCUMENTS

| | | |
|---|---|---|
| 10,498,307 B2 | 12/2019 | Velez et al. |
| 11,183,471 B2 | 11/2021 | Nakashiba |
| 2008/0102409 A1 | 5/2008 | Lee et al. |
| 2021/0143112 A1 | 5/2021 | Nakashiba |
| 2022/0005811 A1* | 1/2022 | Kim .................... H10B 12/053 |

* cited by examiner

SEMICONDUCTOR DEVICE INCLUDING PAD PATTERN

CROSS-REFERENCE TO RELATED APPLICATION

This application claims priority to Korean Patent Application No. 10-2022-0081374 filed on Jul. 1, 2022 in the Korean Intellectual Property Office, the disclosure of which is incorporated herein by reference in its entirety.

BACKGROUND

Example embodiments of the present disclosure relate to a semiconductor device including an inductor conductive pattern.

Generally, an electronic product includes an inductor, and a passive device, along with a semiconductor device. Such an inductor may be mounted on a board of an electronic product as a component outside the semiconductor device.

Information disclosed in this Background section has already been known to or derived by the inventors before or during the process of achieving the embodiments of the present application, or is technical information acquired in the process of achieving the embodiments. Therefore, it may contain information that does not form the prior art that is already known to the public.

SUMMARY

Provided are a semiconductor device including an inductor and a method of manufacturing the same.

Additional aspects will be set forth in part in the description which follows and, in part, will be apparent from the description, or may be learned by practice of the presented embodiments.

According to an aspect of an example embodiment, a semiconductor device may include a lower structure, a data storage structure on the lower structure, and an inductor structure on the lower structure, where the data storage structure includes first electrodes extending in a vertical direction perpendicular to an upper surface of the lower structure, a second electrode provided on the first electrodes, and a dielectric layer between the first electrodes and the second electrode, and where the inductor structure includes an inductor conductive pattern at a level that is substantially the same as a level of the first electrodes.

According to an aspect of an example embodiment, a semiconductor device may include a cell transistor including a first source/drain region, a second source/drain region, and a gate electrode, a bit line connected to the first source/drain region, a bit line connection structure including a bit line contact portion contacting the bit line and a bit line wiring portion on the bit line contact portion, a contact structure connected to the second source/drain region, data storage structure including a first electrode contacting the contact structure, a second electrode provided on the first electrode, and a dielectric layer between the first electrode and the second electrode, an inductor conductive pattern including a first end portion, a second end portion, and at least one line portion extending from the first end portion to the second end portion, a first inductor connection structure connected to the first end portion of the inductor conductive pattern, and a second inductor connection structure connected to the second end portion of the inductor conductive pattern, where the bit line wiring portion is on a level higher than a level of the bit line and is on a level lower than a level of the data storage structure, the inductor conductive pattern is at a level different from a level of the bit line wiring portion, the first inductor connection structure includes a first contact portion at a level that is the same as a level of the bit line wiring portion, and the second inductor connection structure includes a second contact portion at a level that is the same as a level of the bit line wiring portion.

According to an aspect of an example embodiment, a semiconductor device may include a substrate, a memory cell array region, an inductor region, a first extension region on a first side of the memory cell array region, a second extension region on a second side of the memory cell array region, active regions on the substrate, an isolation region on the substrate and defining the active regions, a gate trench in the memory cell array region and the first extension region, intersecting a cell active region in the memory cell array region among the active regions, and extending into the isolation region, a gate structure in the gate trench and including a gate electrode, a bit line in the memory cell array region and the second extension region, intersecting the cell active region in a direction intersecting the gate structure on a level higher than a level of the gate structure, and connected to a first source/drain region in the cell active region, a contact structure on a second source/drain region in the cell active region and connected to the second source/drain region, a data storage structure including a first electrode contacting the contact structure on the contact structure, a second electrode provided on the first electrode, and a dielectric layer in the memory cell array region and between the first electrode and the second electrode, a gate connection structure connected to the gate electrode in the first extension region and including a gate contact portion contacting the gate electrode on the gate electrode and a gate wiring portion on the gate contact portion, a bit line connection structure in the second extension region and including a bit line contact portion contacting the bit line on the bit line and a bit line wiring portion on the bit line contact portion, an inductor conductive pattern in the inductor region and including a first end portion, a second end portion, and at least one line portion extending from the first end portion to the second end portion, a first inductor connection structure in the inductor region and connected to the first end portion of the inductor conductive pattern, and a second inductor connection structure in the inductor region and connected to the second end portion of the inductor conductive pattern, where the bit line wiring portion and the gate wiring portion are on a level higher than a level of the bit line and are on a level lower than a level of the data storage structure, the inductor conductive pattern is at a level different from a level of the bit line wiring portion, the first inductor connection structure includes a first contact portion at a level that is the same as a level of the bit line wiring portion, and the second inductor connection structure includes a second contact portion at a level that is the same as a level of the bit line wiring portion.

BRIEF DESCRIPTION OF DRAWINGS

The above and other aspects, features, and advantages of certain example embodiments of the present disclosure will be more apparent from the following description taken in conjunction with the accompanying drawings, in which.

DETAILED DESCRIPTION

Figure 1:
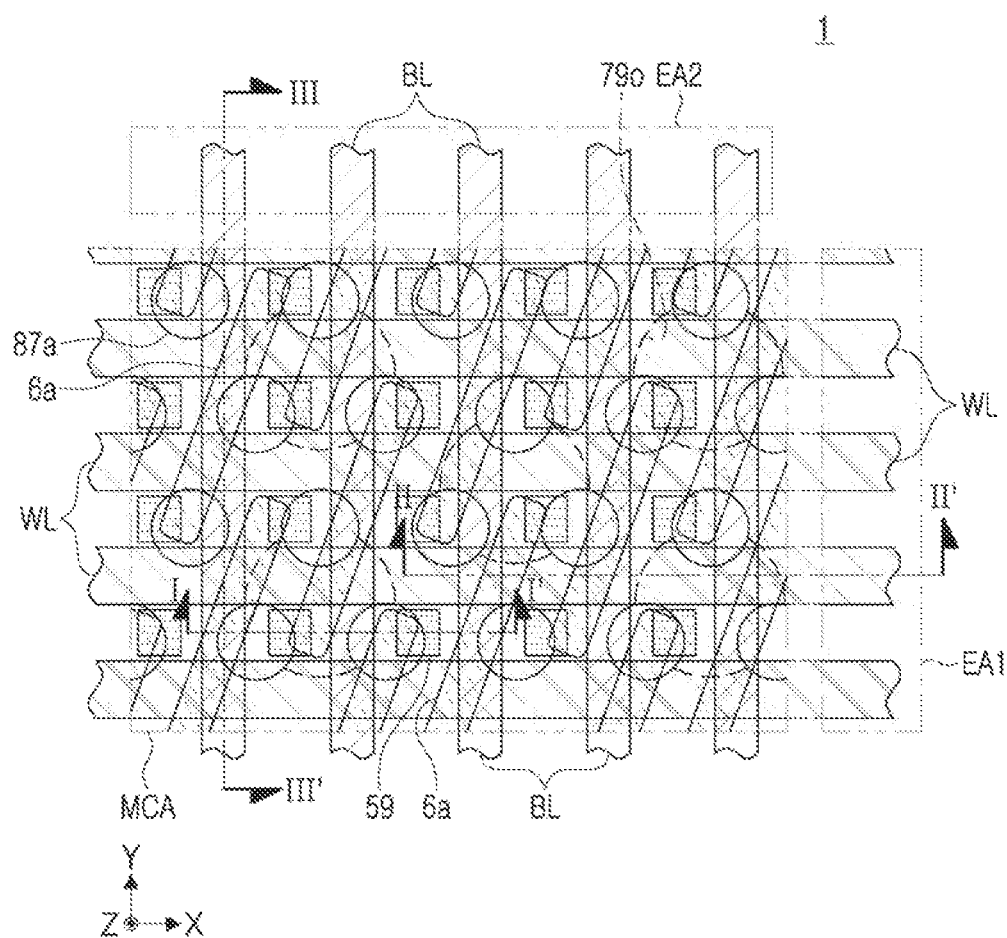
FIGS. 1, 2, 3A, and 3B are diagrams illustrating a semiconductor device according to an example embodiment of the present disclosure.

Hereinafter, example embodiments of the disclosure will be described in detail with reference to the accompanying drawings. The same reference numerals are used for the same components in the drawings, and redundant descriptions thereof will be omitted. The embodiments described herein are example embodiments, and thus, the disclosure is not limited thereto and may be realized in various other forms.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 2:
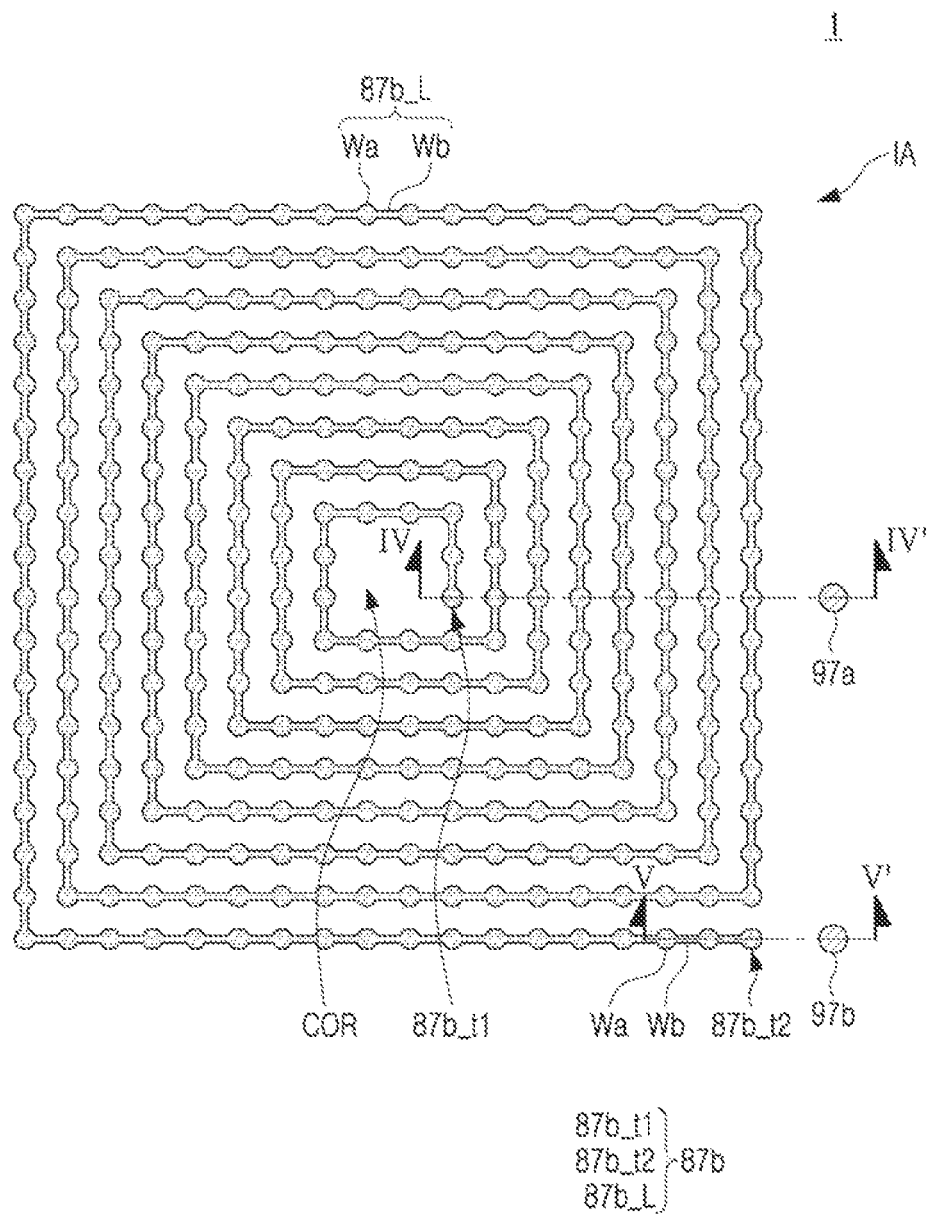
Figure 3A:
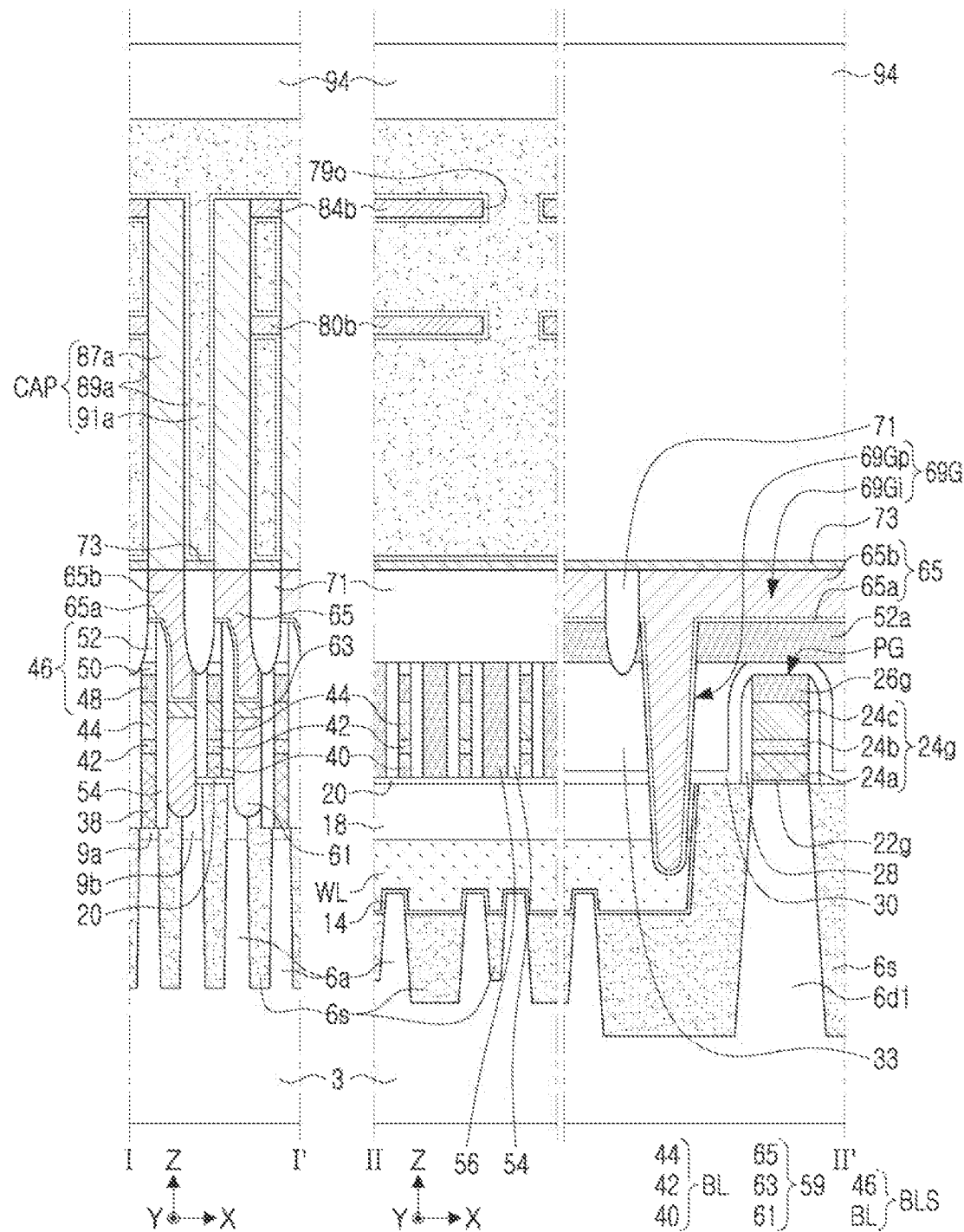
Figure 3B:
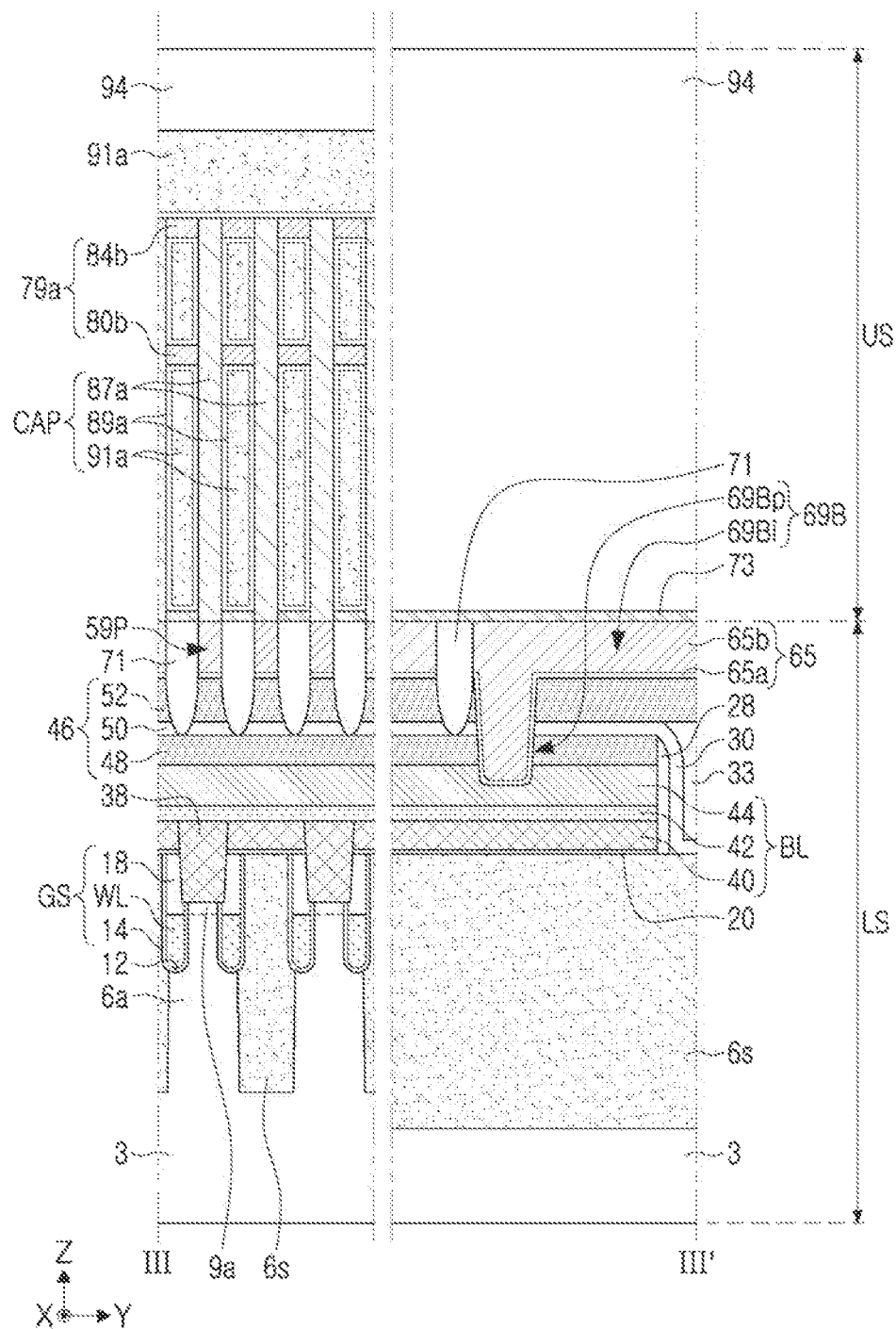
Figure 4A:
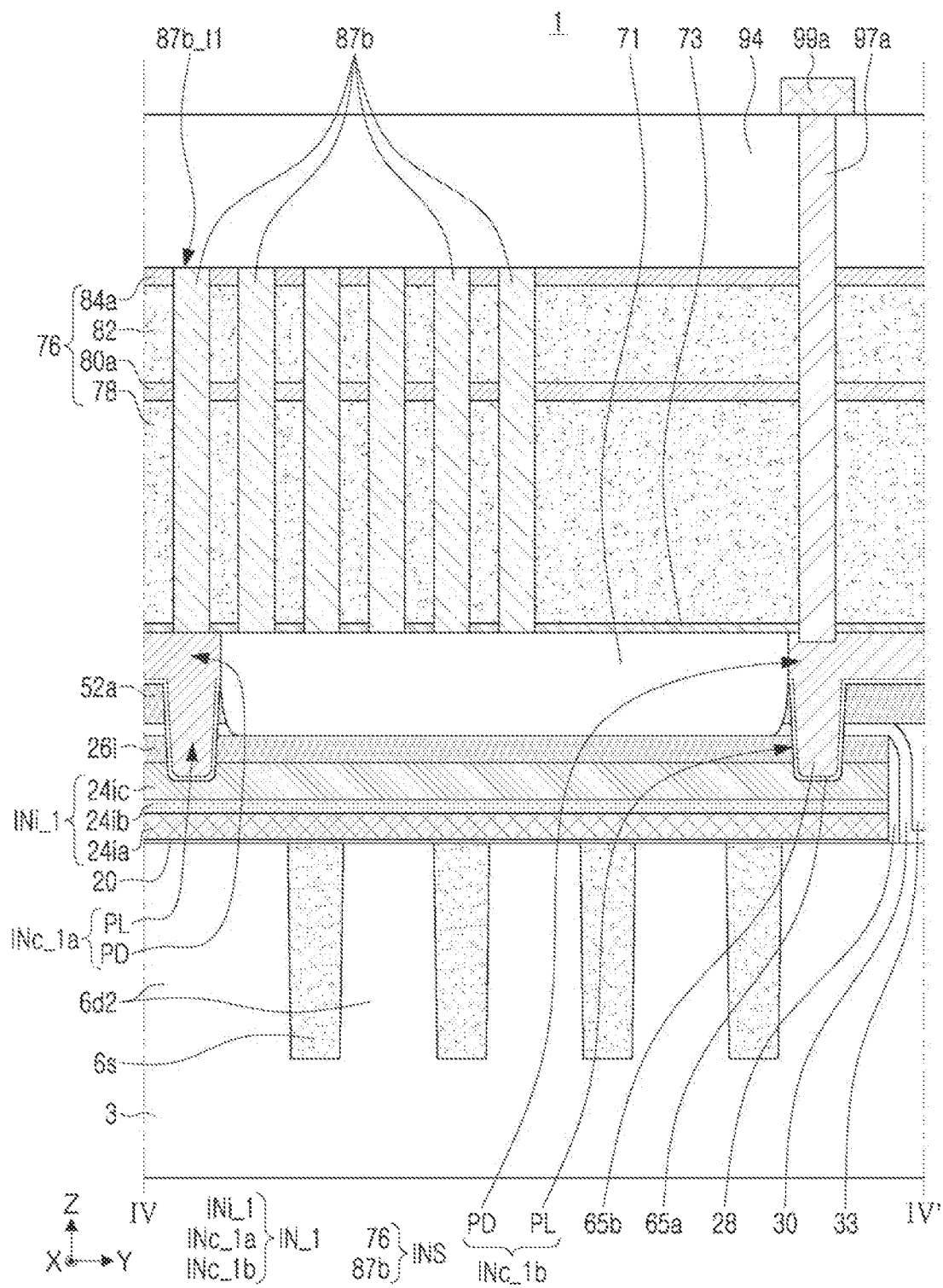
FIGS. 4A and 4B are cross-sectional diagrams illustrating a modified example of a semiconductor device according to an example embodiment of the present disclosure.
Figure 4B:
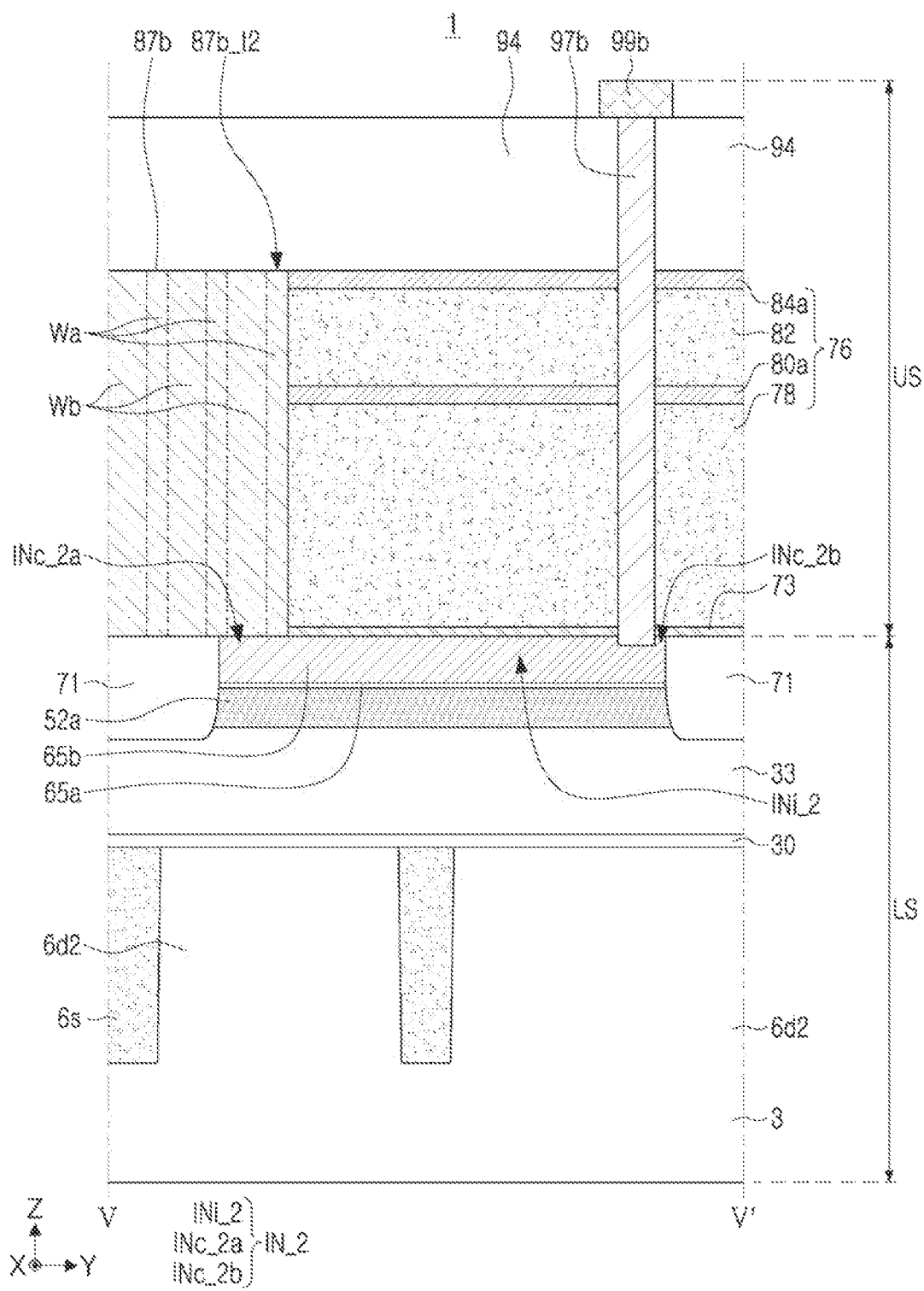

FIGS. 1, 2, 3A, and 3B are diagrams illustrating a semiconductor device according to an example embodiment of the present disclosure. FIGS. 4A and 4B are cross-sectional diagrams illustrating a modified example of a semiconductor device according to an example embodiment of the present disclosure.

An example embodiment of a semiconductor device will be described with reference to FIGS. 1, 2, 3A, 3B, 4A and 4B. FIGS. 1 and 2 are diagrams illustrating an example of a semiconductor device viewed from above, FIG. 3A is a cross-sectional diagram taken along lines I-I' and II-II' in FIG. 1, FIG. 3B is a cross-sectional diagram taken along line III-III' in FIG. 1, FIG. 4A is a cross-sectional diagram taken along line IV-IV' in FIG. 2, and FIG. 4B is a cross-sectional diagram taken along line V-V' in FIG. 2.

Referring to FIGS. 1, 2, 3A, 3B, 4A, and 4B, the semiconductor device 1 according to an example embodiment may include a memory cell array region MCA, a first extension region EA1, a second extension region EA2, and an inductor region IA. The first extension region EA1 may be disposed on a first side of the memory cell array region MCA, and the second extension region EA2 may be disposed on a second side of the memory cell array region MCA.

The semiconductor device 1 may further include a lower structure LS and an upper structure US on the lower structure LS. The lower structure LS and the upper structure US may be disposed in the memory cell array region MCA, the first extension region EA1, the second extension region EA2, and the inductor region IA.

The lower structure LS may include the memory cell array region MCA, the first extension region EA1, the second extension region EA2, and the substrate 3 disposed in the inductor region IA.

The substrate 3 may be a semiconductor substrate. For example, the substrate 3 may include a semiconductor material, such as, for example, a group IV semiconductor, a group III-V compound semiconductor, or a group II-VI compound semiconductor. For example, the group IV semiconductor may include silicon, germanium, or silicon-germanium. The substrate 3 may further include impurities. The substrate 3 may include a silicon substrate, a silicon on insulator (SOI) substrate, a germanium substrate, a germanium on insulator (GOI) substrate, a silicon-germanium substrate, or an epitaxial layer.

The lower structure LS may further include an isolation region 6s defining active regions 6a, 6d1, and 6d2 on the substrate 3.

The isolation region 6s may be a trench isolation layer. The isolation region 6s may be disposed on the substrate 3 and may define side surfaces of the active regions 6a, 6d1, and 6d2. The isolation region 6s may include an insulating material such as silicon oxide and/or silicon nitride. The active regions 6a, 6d1 and 6d2 may protrude from the substrate 3 in the vertical direction Z.

The active regions 6a, 6d1, and 6d2 may include cell active regions 6a in the memory cell array region MCA, peripheral active regions 6d1 on an external side of the first and second extension regions EA1 and EA2, and dummy active regions 6d2 in the inductor region IA.

Each of the cell active regions 6a may have a bar shape extending in a diagonal direction D between a first direction X and a second direction Y perpendicular to the first direction X.

In another example, in the inductor region IA, the dummy active regions 6d2 may be modified to a dummy active region 6d2 integrated with the substrate 3.

In another example, in the inductor region IA, the dummy active regions 6d2 may not be provided, and the dummy active regions 6d2 may be replaced with the isolation region 6s.

The lower structure LS may include gate trenches 12 intersecting the cell active regions 6a and extending to the isolation region 6s, gate structures GS disposed in the gate trenches 12, and first source/drain regions 9a and second source/drain regions 9b disposed in the cell active regions 6a adjacent to side surfaces of the gate structures GS.

The gate structures GS may intersect the memory cell array region MCA and may extend into the first extension region EA1. Each of the gate structures GS may have a line shape extending in the first direction X. A cell active region of the active regions 6a may intersect a pair of cell gate structures adjacent to each other among the gate structures GS.

Each of the gate structures GS may include a gate dielectric layer 14 covering an internal wall of the gate trench 12, a gate electrode WL partially filling the gate trench 12 on the gate dielectric layer 14, and a gate capping pattern 18 filling the other portion of the gate trench 12 on the gate electrode WL. The gate dielectric layer 14, the gate electrode WL, and the first and second source/drain regions 9a and 9b may be included in the cell transistors.

The gate electrodes WL may be referred to as word lines.

The gate dielectric layers 14 may include at least one of silicon oxide and a high-k dielectric. The high-k dielectric may include a metal oxide or a metal oxynitride. The word lines WL may be implemented as word lines of a memory semiconductor device such as a dynamic random access memory (DRAM). The word lines WL may include doped polysilicon, metal, conductive metal nitride, a metal-semiconductor compound, conductive metal oxide, graphene, carbon nanotube, or a combination thereof. For example, the word lines WL may include at least one of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO$_x$, RUO$_x$, graphene, and carbon nanotube. The gate capping patterns 18 may include an insulating material, such as, for example, silicon nitride.

The lower structure LS may further include a buffer insulating layer 20 disposed on the active regions 6a, 6d1, and 6d2, the isolation region 6s, and the gate structures GS. The buffer insulating layer 20 may include silicon oxide and/or silicon nitride.

The lower structure LS may further include bit lines BL disposed on the buffer insulating layer 20, and bit line contact plugs 38 penetrating through the buffer insulating layer 20 below the bit lines BL and electrically connected to the first source/drain regions 9a.

The bit lines BL may intersect the memory cell array region MCA and may extend into the second extension region EA2. Each of the bit lines BL may have a line shape extending in the second direction Y.

Each of the bit lines BL may include a first conductive layer 40, a second conductive layer 42, and a third conductive layer 44 stacked in order. For example, the first conductive layer 40 may include doped silicon, such as, for example, polysilicon having N-type conductivity, and the second and third conductive layers 42 and 44 may include different conductive materials, such as, for example, different conductive materials from among Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO$_x$, RUO$_x$, graphene, and carbon nanotubes. The bit line contact plugs 38 may include doped silicon, such as, for example, polysilicon having N-type conductivity.

In an example, the bit line contact plugs 38 may penetrate the first conductive layer 40 of the bit lines BL and may contact the second conductive layer 42.

In another example, the bit line contact plugs 38 may be disposed below the first conductive layer 40 of the bit lines BL and may contact the first conductive layer 40.

The lower structure LS may further include bit line capping patterns 46 aligned with the bit lines BL on the bit lines BL. The bit lines BL and the bit line capping patterns 46 stacked in order may form bit line structures BLS.

Each of the bit line capping patterns 46 may include a first capping layer 48, a second capping layer 50, and a third capping layer 52 stacked in order. The bit line capping patterns 46 may be formed of an insulating material. Each of the first to third capping layers 48, 50, and 52 may be formed of silicon nitride or a silicon nitride-based insulating material.

The lower structure LS may include insulating spacers 54 disposed on side surfaces of the bit lines BL and the bit line capping patterns 46, and an insulating fence 56 disposed between the bit lines BL.

The lower structure LS may further include contact structures 59 electrically connected to the second source/drain regions 9b on the second source/drain regions 9b.

Each of the contact structures 59 may include a lower contact plug 61 penetrating through the buffer insulating layer 20 and contacting the second source/drain region 9b, an upper contact plug 65 disposed on the lower contact plug 61, and a metal-semiconductor compound pattern 63 disposed between the lower contact plug 61 and the upper contact plug 65. The lower contact plug 61 may include doped silicon, such as, for example, polysilicon having N-type conductivity. The upper contact plug 65 may include a first layer 65a and a second layer 65b. The first layer 65a may cover a lower surface of the second layer 65b. The second layer 65b may include a metal such as tungsten, and the first layer 65a may include a barrier material such as TiN or TaN.

In each of the contact structures 59, the upper contact plug 65 may be disposed on a level higher than a level of the bit line capping pattern 46, and may include a pad portion 59P extending to the bit line capping pattern 46 adjacent to the upper contact plug 65. Accordingly, the contact structures 59 may include the pad portions 59P. Each of the pad portions 59P may include a region vertically overlapping the bit lines BL and a region not vertically overlapping the bit lines BL.

The lower structure LS may further include a peripheral gate structure PG disposed on the peripheral active region 6d1. The peripheral gate structure PG may include a peripheral gate dielectric layer 22g, a peripheral gate electrode 24g, and a peripheral gate capping pattern 26g stacked in order. The peripheral gate capping pattern 26g may be formed of an insulating material. The peripheral gate electrode 24g may be disposed at substantially the same level as a level of the bit lines BL. The peripheral gate electrode 24g may include at least one material from among the materials of the bit lines BL. The peripheral gate electrode 24g may include a first electrode layer 24a, a second electrode layer 24b, and a third electrode layer 24c stacked in order. The first electrode layer 24a may include the same material as that of the first conductive layer 40, the second electrode layer 24b may include the same material as that of the second conductive layer 42, and the third electrode layer 24c may include the same material as that of the third conductive layer 44.

The lower structure LS may further include a peripheral gate capping pattern 26g aligned with the peripheral gate electrode 24g on the peripheral gate electrode 24g. The peripheral gate capping pattern 26g may be formed to have substantially the same thickness as that of the first capping layer 48 of the bit line capping pattern 46 and may be formed of the same material as that of first capping layer 48. For example, the peripheral gate capping pattern 26g may include silicon nitride.

The lower structure LS may further include a connection pattern INi_1 disposed in the inductor region IA and an insulating capping pattern 26i disposed on the connection pattern INi_1.

The connection pattern INi_1 may be disposed on the buffer insulating layer 20 in the inductor region IA. The connection pattern INi_1 may include a first connection layer 24ia, a second connection layer 24ib, and a third connection layer 24ic stacked in order. The first connection layer 24ia may include the same material as that of the first conductive layer 40, the second connection layer 24ib may include the same material as that of the second conductive layer 42, and the third connection layer 24ic may include the same material as that of the third conductive layer 44.

The insulating capping pattern 26i may be formed to have substantially the same thickness as that of the peripheral gate capping pattern 26g and may be formed of the same material as that of the peripheral gate capping pattern 26g.

The lower structure LS may further include insulating spacers 28, a lower etch stop layer 30, and an interlayer insulating layer 33.

The insulating spacers 28 may cover side surfaces of the peripheral gate structure PG and side surfaces of the connection pattern INi_1 and the insulating capping pattern 26i stacked in order.

The lower etch stop layer 30 may be disposed in the first and second extension regions EA1 and EA2 and the inductor region IA, and may be disposed on the buffer insulating layer 20. The lower etch stop layer 30 may cover the gate capping pattern 26g, the insulating capping pattern 26i, and the insulating spacers 28. The lower etch stop layer 30 may include an insulating material such as silicon nitride.

The interlayer insulating layer 33 may be disposed in the first and second extension regions EA1 and EA2 and the inductor region IA, and may be disposed on the lower etch stop layer 30. An upper surface of the interlayer insulating layer 33 may be coplanar with an upper surface of the lower etch stop layer 30 disposed on the gate capping pattern 26g and the insulating capping pattern 26i.

The lower structure LS may further include an upper capping insulating layer 52a disposed in the first and second extension regions EA1 and EA2 and the inductor region IA. The upper capping insulating layer 52a may be disposed on the interlayer insulating layer 33 and the lower etch stop layer 30.

The lower structure LS may further include first contact pattern INc_1a and second contact pattern INc_1b penetrating through the upper capping insulating layer 52a, electrically connected to the connection pattern INi_1, and spaced apart from each other in the inductor region IA.

Each of the first and second contact patterns INc_1a and INc_1b may include a plug portion PL penetrating through the upper capping insulating layer 52a and contacting the connection pattern INi_1, and a pad portion PD disposed on a level higher than a level of the upper capping insulating layer 52a. Each of the first and second contact patterns INc_1a and INc_1b may include the same material as that of the upper contact plug 65. For example, each of the first and second contact patterns INc_1a and INc_1b may include the first layer 65a and the second layer 65b. The first layer 65a may cover a lower surface of the second layer 65b.

The connection pattern INi_1, the first contact pattern INc_1a, and the second contact pattern INc_1b may form a first inductor connection structure IN_1.

The lower structure LS may further include a second inductor connection structure IN_2. The second inductor connection structure IN_2 may be disposed at substantially the same level as a level of the pad portion PD. The second inductor connection structure IN_2 may include the same material as that of the upper contact plug 65, such as, for example, the first layer 65a and the second layer 65b disposed on the first layer 65a.

The second inductor connection structure IN_2 may include a first contact portion INc_2a, a second contact portion INc_2b, and a connection portion INi_2 disposed between the first and second contact portions INc_2a and INc_2b.

The lower structure LS may further include gate connection structures 69G disposed in the first extension region EA1 and bit line connection structures 69B disposed in the second extension region EA2.

The gate connection structures 69G may penetrate through the upper capping insulating layer 52a, the interlayer insulating layer 33, and the gate capping pattern 18 and may be electrically connected to the word lines WL. Each of the gate connection structures 69G may include a plug portion 69Gp contacting the word line WL and penetrating through the upper capping insulating layer 52a, the interlayer insulating layer 33, and the gate capping pattern 18, and a wiring portion 69Gi disposed on a level higher than a level of the upper capping insulating layer 52a on the plug portion 69Gp. Each of the gate connection structures 69G may include the same material as that of the upper contact plug 65, that is, for example, the first layer 65a and the second layer 65b disposed on the first layer 65a.

The bit line connection structures 69B may penetrate through the bit line capping pattern 46 and may be electrically connected to the bit lines BL. Each of the bit line connection structures 69B may include a contact portion 69Bp contacting the bit line BL and penetrating through the bit line capping pattern 46, and a bit line wiring portion 69Bi disposed on a level higher than a level of the bit line capping pattern 46 on the contact portion 69Bp. Each of the bit line connection structures 69B may be formed of the same material as that of the upper contact plug 65, such as, for example, the first layer 65a and the second layer 65b disposed on the first layer 65a.

The lower structure LS may further include an insulating isolation pattern 71 passing the regions between the wiring portions 69Gi of the gate connection structures 69G, the wiring portions 69Bi of the bit line connection structures 69B, and the pad portions 59P of the contact structures 59 and extending downwardly. The insulating isolation pattern 71 may include an insulating material such as silicon nitride. A lower surface of the insulating isolation pattern 71 may be disposed on a level higher than a level of the bit lines BL.

The lower structure LS may have a substantially flat upper surface. For example, the wiring portions 69Gi of the gate connection structures 69G, the wiring portions 69Bi of the bit line connection structures 69B, and the pad portion 59P of the contact structures 59, and the upper surfaces of the insulating isolation pattern 71 may be coplanar with each other.

The upper structure US may include an upper etch stop layer 73 disposed on the lower structure LS. The upper etch stop layer 73 may be disposed on the wiring portions 69Gi of the gate connection structures 69G, the wiring portions 69Bi of the bit line connection structures 69B, the pad portions 59P of the contact structures 59, and the upper surfaces of the insulating isolation pattern 71. The upper etch stop layer 73 may include at least one of a SiBN material and a SiCN material.

The upper structure US may further include a data storage structure CAP in the memory cell array region MCA and an inductor structure INS in the inductor region IA.

The data storage structure CAP may include first electrodes 87a electrically connected to the pad portions 59P, a second electrode 91a covering the first electrodes 87a, and a dielectric layer 89a disposed between the first electrodes 87a and the second electrode 91a. The first electrodes 87a may penetrate the upper etch stop layer 73, may contact the pad portions 59P, and may extend upwardly. Each of the first electrodes 87a may extend in a vertical direction Z perpendicular to the upper surface of the lower structure LS. Each of the first electrodes 87a may have a column shape extending in the vertical direction Z perpendicular to the upper surface of the lower structure LS.

The data storage structure CAP may be implemented as memory cell capacitors for storing data in a memory such as DRAM.

The upper structure US may further include at least one supporter layer 79a contacting the first electrodes 87a and having an opening 79o. The at least one supporter layer 79a may prevent collapsing and deforming of the first electrodes 87a between the first electrodes 87a. The at least one supporter layer 79a may include an insulating material such as silicon nitride. The at least one supporter layer 79a may include a lower supporter layer 80b and an upper supporter layer 84b disposed on a level higher than a level of the lower supporter layer 80b. The dielectric layer 89a may be disposed between the first electrodes 87a and the second electrode 91a and between the at least one supporter layer 79a and the second electrode 91a.

The inductor structure INS may include an inductor conductive pattern 87b. The inductor structure INS may further include an insulating structure 76.

The insulating structure 76 may be disposed on the etch stop layer 73. The inductor conductive pattern 87b may penetrate the insulating structure 76 and the etch stop layer 73. The insulating structure 76 may contact a side surface of the inductor conductive pattern 87b.

The inductor conductive pattern 87b may be disposed at substantially the same level as a level of the first electrodes 87a. The inductor conductive pattern 87b may be formed of the same material as that of the first electrodes 87a.

The inductor conductive pattern 87b may be disposed on a level different from that of the bit line wiring portion 69Bi. The inductor conductive pattern 87b may be disposed on a level higher than a level of the bit line wiring portion 69Bi.

A side surface of the inductor conductive pattern 87b may have a wavy shape. For example, the inductor conductive pattern 87b may include first portions Wa and second portions Wb connecting the first portions Wa to each other and having a width smaller than that of the first portions Wa. In the inductor conductive pattern 87b, the first portions Wa may be pillars, and the second portions Wb may be bridges connecting the first portions Wa, that is, pillars.

The inductor conductive pattern 87b may include a first end portion 87b_t1, a second end portion 87b_t2, and a line portion 87b_L disposed between the first end portion 87b_t1 and the second end portion 87b_t2. The line portion 87b_L may extend from the first end portion 87b_t1 to the second end portion 87b_t2. The first end portion 87b_t1 may be referred to as a first terminal, and the second end portion 87b_t2 may be referred to as a second terminal.

The inductor conductive pattern 87b may be a spiral inductor. The first end portion 87b_t1 may be the inner end of the spiral, the second end portion 87b_t2 may be the outer end of the spiral, and the line portion 87b_L may connect the first end 87b_t1 to the second end portion 87b_t2. The line portion 87b_L may extend from the first end 87b_t1 to the second end portion 87b_t2.

The first end portion 87b_t1 may be electrically connected to the first contact pattern INc_1a of the first inductor connection structure Ni,_ and the second end portion 87b_t2 may be electrically connected to the first contact portion INc_2a of the second inductor connection structure IN_2. A lower surface of the first end portion 87b_t1 may contact the first contact pattern INc_1a of the first inductor connection structure IN_1, and a lower surface of the second end portion 87b_t2 may contact the first contact portion INc_2a of the second inductor connection structure IN2.

The insulating structure 76 may include a first insulating layer 78, a second insulating layer 80a, a third insulating layer 82, and a fourth insulating layer 84a stacked in order. A thickness of each of the first and third insulating layers 78 and 82 may be greater than a thickness of each of the second and fourth insulating layers 80a and 84a. The first and third insulating layers 78 and 82 may include an insulating material such as silicon oxide. The second and fourth insulating layers 80a and 84a may include a material different from that of the first and third insulating layers 78 and 82, such as, for example, an insulating material such as silicon nitride. The second and fourth insulating layers 80a and 84a may be formed of the same material as that of the lower and upper supporter layers 80b and 84b. The second and fourth insulating layers 80a and 84a may be referred to as a lower insulating layer 80a and an upper insulating layer 84a, and the first and the first and third insulating layers 78 and 82 may be referred to as a lower mold insulating layer 78 and an upper mold insulating layer 82.

The inductor structure INS may further include a core region COR surrounded by the inductor conductive pattern 87b. The core region COR may be formed of the insulating structure 76.

The upper structure US may further include upper interlayer insulating layer 94 covering the data storage structure CAP, the upper etch stop layer 73 in the first and second extension regions EA1 and EA2, and the inductor structure INS.

The upper structure US may further include contact plugs 97a and 97b penetrating the upper interlayer insulating layer 94, the insulating structure 76, and the upper etch stop layer 73 in the inductor region IA, and interconnections 99a and 99b disposed on the contact plugs 97a and 97b.

The contact plugs 97a and 97b may include a first contact plug 97a electrically connected to and contacting the second contact pattern INc_1b of the first inductor connection structure IN_1, and a second contact plug 97b electrically connected to and contacting the second contact portion INc_2b of the second inductor connection structure IN_2. The interconnections 99a and 99b may include a first wiring 99a disposed on the first contact plug 97a and a second wiring 99b disposed on the second contact plug 97b.

In example embodiments, the cell transistors may include the gate dielectric layer 14, the gate electrode WL, and the first and second source/drain regions 9a and 9b, but an example embodiment thereof is not limited thereto. For example, the lower structure LS may include a lower source/drain region and an upper source/drain region spaced apart from each other in a vertical direction instead of the cell transistors, gate electrodes WL, and source/drain regions 9a, and 9b, a vertical channel region disposed between the lower and upper source/drain regions, and a vertical channel transistor including a gate structure opposing a side surface of the vertical channel region.

In example embodiments, the inductor region IA may be disposed in the dummy region of the substrate 3 in the semiconductor device 1. Accordingly, the inductor conductive pattern 87b of the inductor region Lk may be included without increasing the area of the semiconductor device 1.

In example embodiments, the inductor conductive pattern 87b may be configured as a spiral inductor surrounding the inductor core region COR. The inductor conductive pattern 87b may be referred to as an inductor coil.

In example embodiments, the inductor conductive pattern 87b, which may be a spiral inductor, may be configured as an inductor for improving signal properties of the semiconductor device 1.

In example embodiments, the inductor conductive pattern 87b may be configured as a radio frequency (RF) inductor at the input/output (I/O) terminal of the semiconductor device 1.

In example embodiments, the inductor conductive pattern 87b may be configured as a power inductor for adjusting a power level in the semiconductor device 1.

In example embodiments, in the spiral inductor conductive pattern 87b, the number of windings may be "N" to adjust the inductance. "N" may be a natural number greater than 2, and "N" may be determined in consideration of resistance of the inductor conductive pattern 87b and inductance required by the semiconductor device 1.

In example embodiments, in the spiral inductor conductive pattern 87b included in the inductor, to adjust the inductance, the outer diameter of the inductor conductive pattern 87b may be adjusted, the size of the inductor core region COR may be adjusted, the width of the line portion 87b_L of the higher conductive pattern 87b may be adjusted, the spacing between the spiral line portions 87b_L may be adjusted, or permeability of the inductor core region COR may be adjusted. Accordingly, the semiconductor device 1 according to an example embodiment may provide various inductors having different inductances.

In example embodiments, a plurality of inductors may be disposed in the inductor region IA. An example of the plurality of inductors will be described with reference to FIG. 5.

Figure 5:
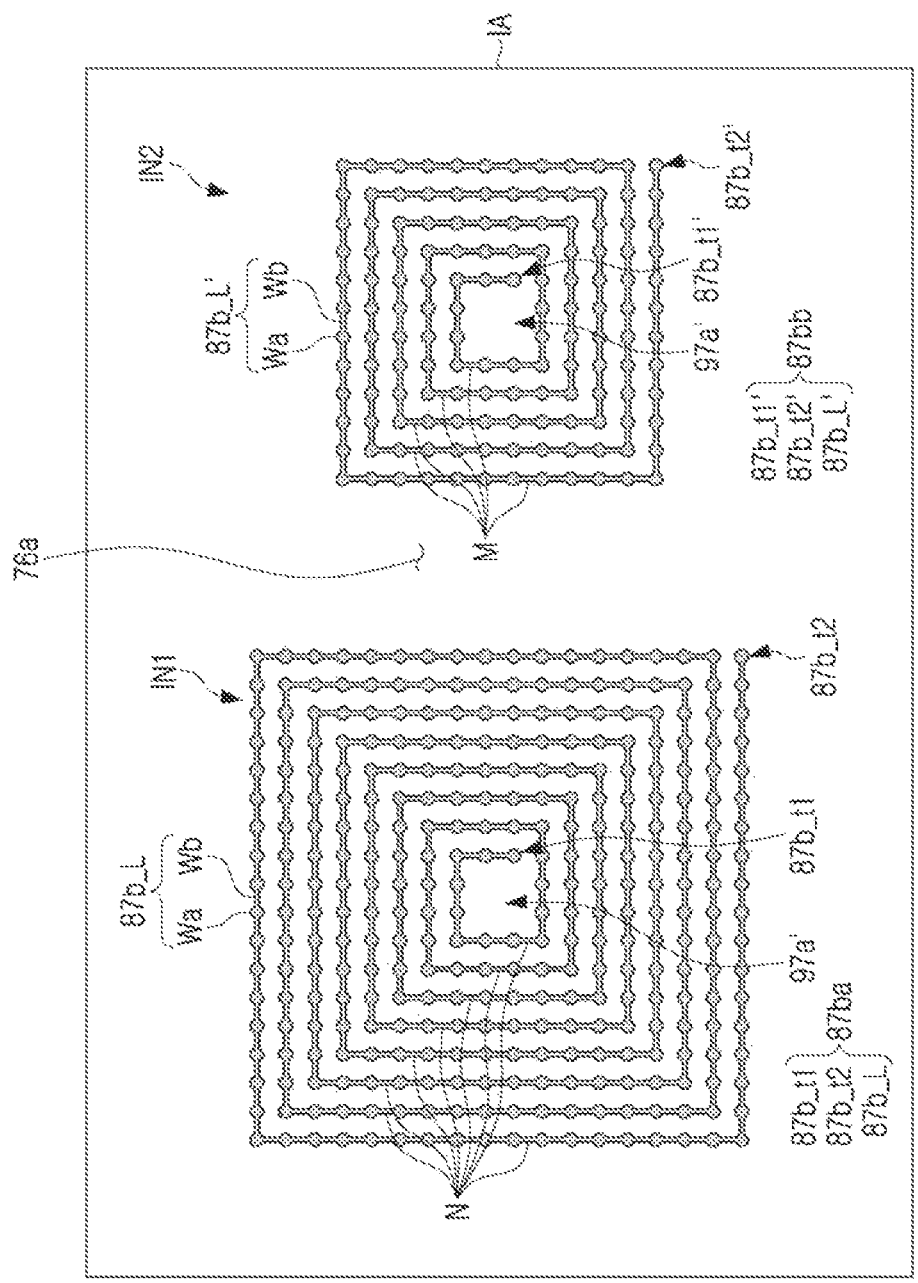
FIG. 5 is a diagram illustrating a modified example of a semiconductor device according to an example embodiment of the present disclosure.

FIG. 5 is a diagram illustrating a modified example of a semiconductor device according to an example embodiment of the present disclosure. FIG. 5 is a diagram illustrating an inductor region including a plurality of inductors.

Referring to FIG. 5, a plurality of inductors may be disposed in the inductor region IA. FIG. 5 illustrates inductors IN1 and IN2 having different inductances disposed in the inductor region IA, but an example embodiment thereof is not limited thereto. For example, the plurality of inductors in the inductor region IA may include inductors having the same inductance and/or inductors having different inductances.

The plurality of inductors may include a first inductor conductive pattern 87ba included in the first inductor Ni and a second inductor conductive pattern 87bb included in the second inductor IN2 having inductance different from that of the first inductor Ni. For example, the first inductor conductive pattern 87ba may have "N" number of windings, and the second inductor conductive pattern 87bb may have "M" number of windings different from "N."

In an example embodiment, the first and second inductor conductive patterns 87ba and 87bb may have a cross-sectional structure substantially the same as or similar to the cross-sectional structure in FIGS. 4A and 4B. For example, the first inductor conductive pattern 87ba may be the same as the first inductor conductive pattern 87b described with reference to FIGS. 2, 4A, and 4B. The second inductor conductive pattern 87bb may have a shape in which the number of windings may be different from that of the first inductor conductive pattern 87ba. For example, the first inductor conductive pattern 87ba may include a first end portion 87b_t1, a second end portion 87b_t2, and a line portion 87b_L connecting the first end portion 87b_t1 to the second end portion 87b_t2. The first inductor conductive pattern 87ba may have a spiral shape and may have an 'N' number of windings. The second inductor conductive pattern 87bb may include a first end portion 87b_t1', a second end portion 87b_t2', and a line portion 87b_L' connecting the first end portion 87b_t1' to the second end portion 87b_t2'. Here, the second inductor conductive pattern 87bb may have a spiral shape, and may have 'M' number of windings different from the 'N'. Here, "N" and "M" may be natural numbers.

In the inductor region IA, a space 76a between the plurality of inductors IN1 and IN2 may be filled with the insulating structure 76 described above. Accordingly, the insulating structure 76 may be disposed in the entire inductor region IA, and the first and second inductor conductive patterns 87ba and 87bb may be disposed to penetrate the insulating structure 76. However, an example embodiment thereof is not limited thereto. For example, in the inductor region IA, a different material which may replace the above-described insulating structure 76, for example, such as, for example, the upper interlayer insulating layer 94 may be disposed in the space 76a between the plurality of inductors IN1 and IN2.

In the example embodiment, to form the first and second inductors IN1 and IN2 having different inductances, different numbers of windings may be provided, but an example embodiment thereof is not limited thereto. For example, inductors according to various example embodiments may be combined together with the above-described inductors, such that inductors having various inductances may be arranged in the inductor region IA.

Hereinafter, various modifications of the components of the above-described example embodiment will be described. Various modifications of the components of the above-described example embodiment as below will be mainly described with respect to the component to be modified or the component to be replaced. Also, the components which may be modified or replaced as described below are described with reference to the drawings, but the components which may be modified or replaced may be combined with each other, or may be combined with the components described above and may be included in the semiconductor device according to an example embodiment.

Figure 6A:
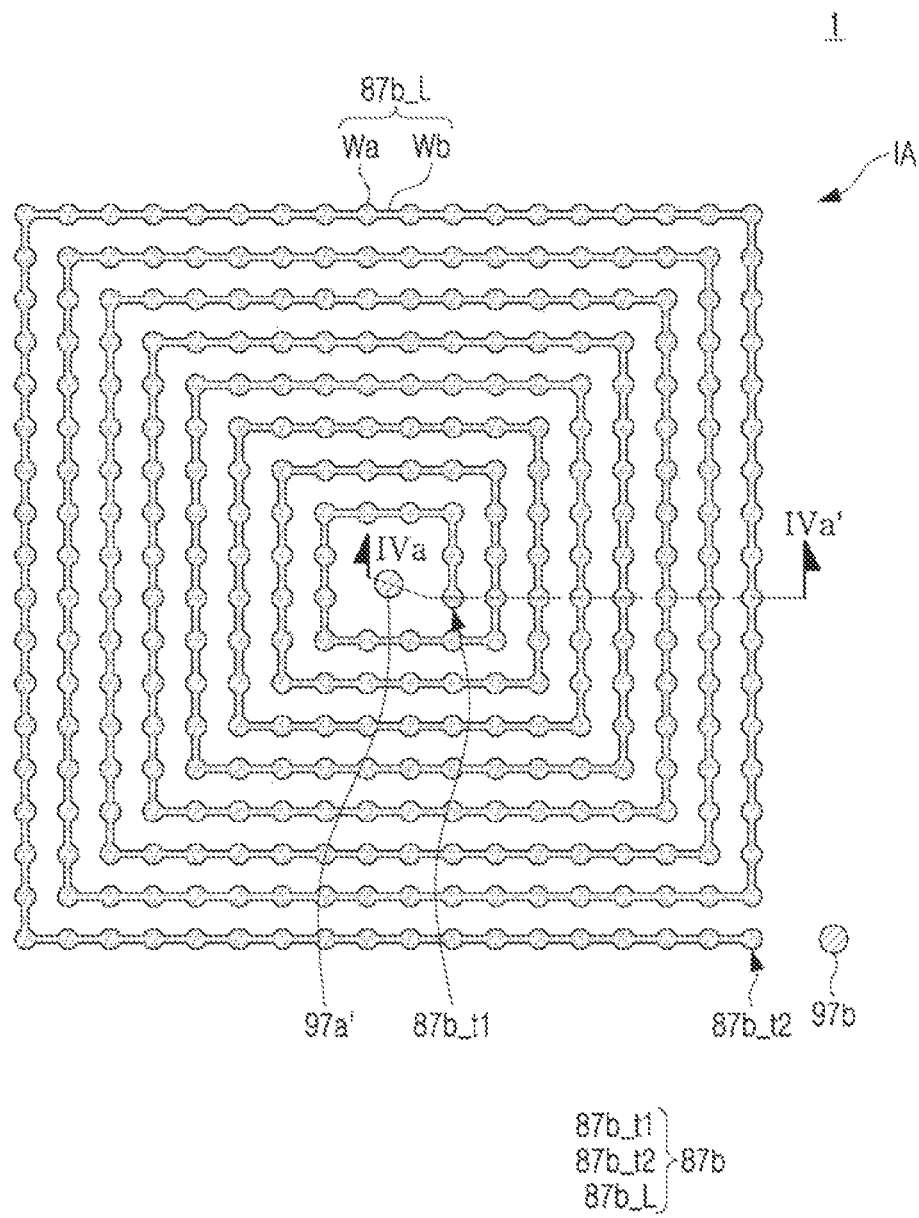
FIGS. 6A and 6B are diagrams illustrating a modified example of a semiconductor device according to an example embodiment of the present disclosure.
Figure 6B:
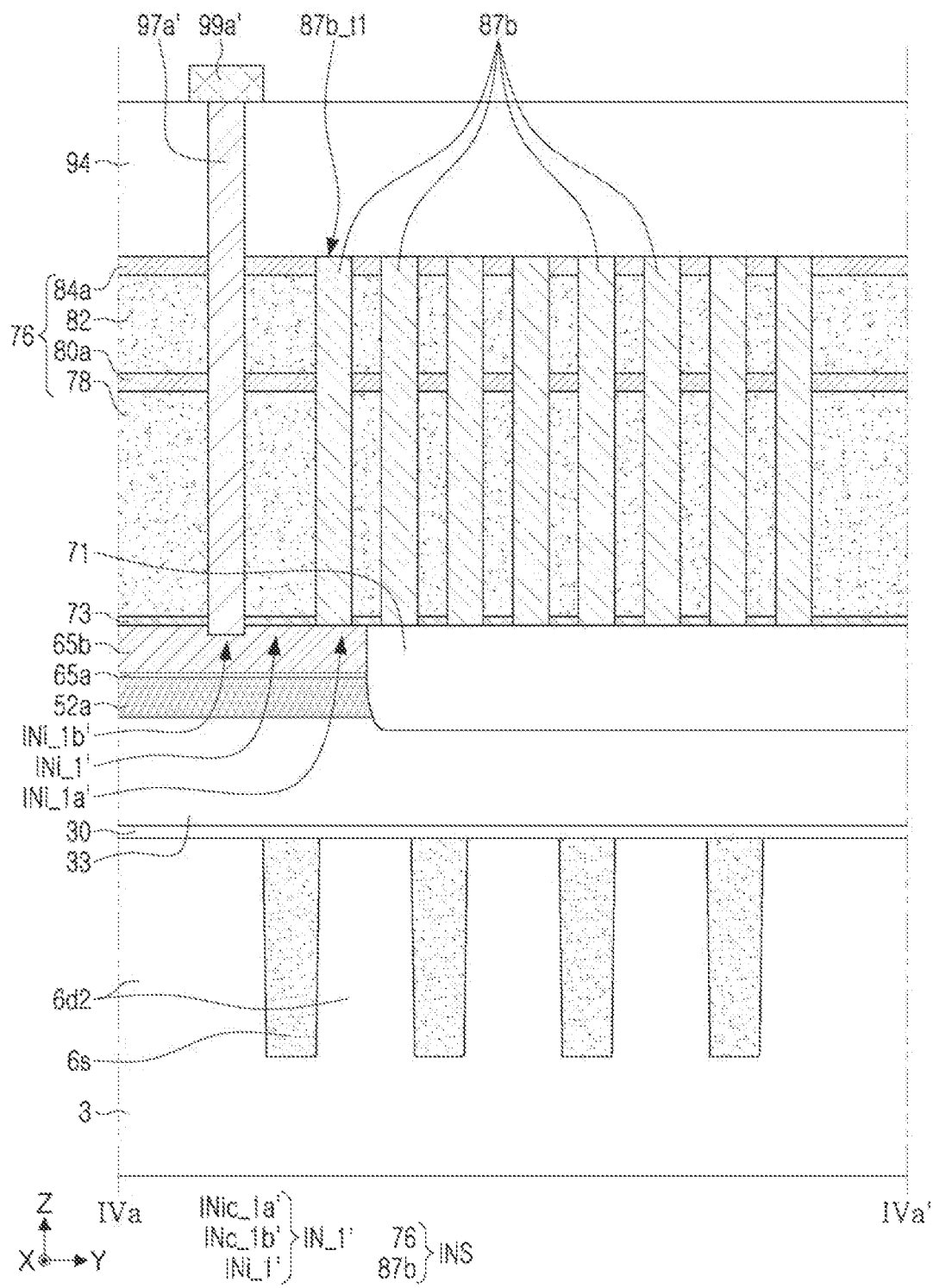

FIGS. 6A and 6B are diagrams illustrating a modified example of a semiconductor device according to an example embodiment of the present disclosure.

A modified example of the first contact plug 97a and the first inductor connection structure IN_1 in the aforementioned example embodiment will be described with reference to FIGS. 6A and 6B. FIG. 6A is a diagram illustrating a modified example of a semiconductor device according to an example embodiment, viewed from the above, and FIG. 6B is a cross-sectional diagram taken along line IVa-IVa' in FIG. 5A.

In a modified example, referring to FIGS. 6A and 6B, the first contact plug 97a described with reference to FIGS. 2 and 4A may be replaced with the first contact plug 97a' disposed in the inner side of the inductor conductive pattern 87b surrounded by the inductor conductive pattern 87b as illustrated in FIGS. 6A and 6B. The first inductor connection structure IN_1 described with reference to FIG. 4A may be replaced with a first inductor connection structure IN_1' electrically connecting the first contact plug 97a' to the first end portion 87b_t1 of the inductor conductive pattern 87b as illustrated in FIG. 6B.

The first inductor connection structure IN_1' may have substantially the same cross-sectional structure as that of the second inductor connection structure IN2. The first inductor connection structure IN_1' may be disposed at substantially the same level as a level of the second inductor connection structure IN2.

The first inductor connection structure IN_1' may include a first contact portion INc_1a' contacting the first end portion 87b_t1 of the inductor conductive pattern 87b, a second contact portion INc_1b' contacting the first contact plug 97a', and a connection portion INi_1' disposed between the first and second contact portions INc_1a' and INc_1b'.

Figure 7A:
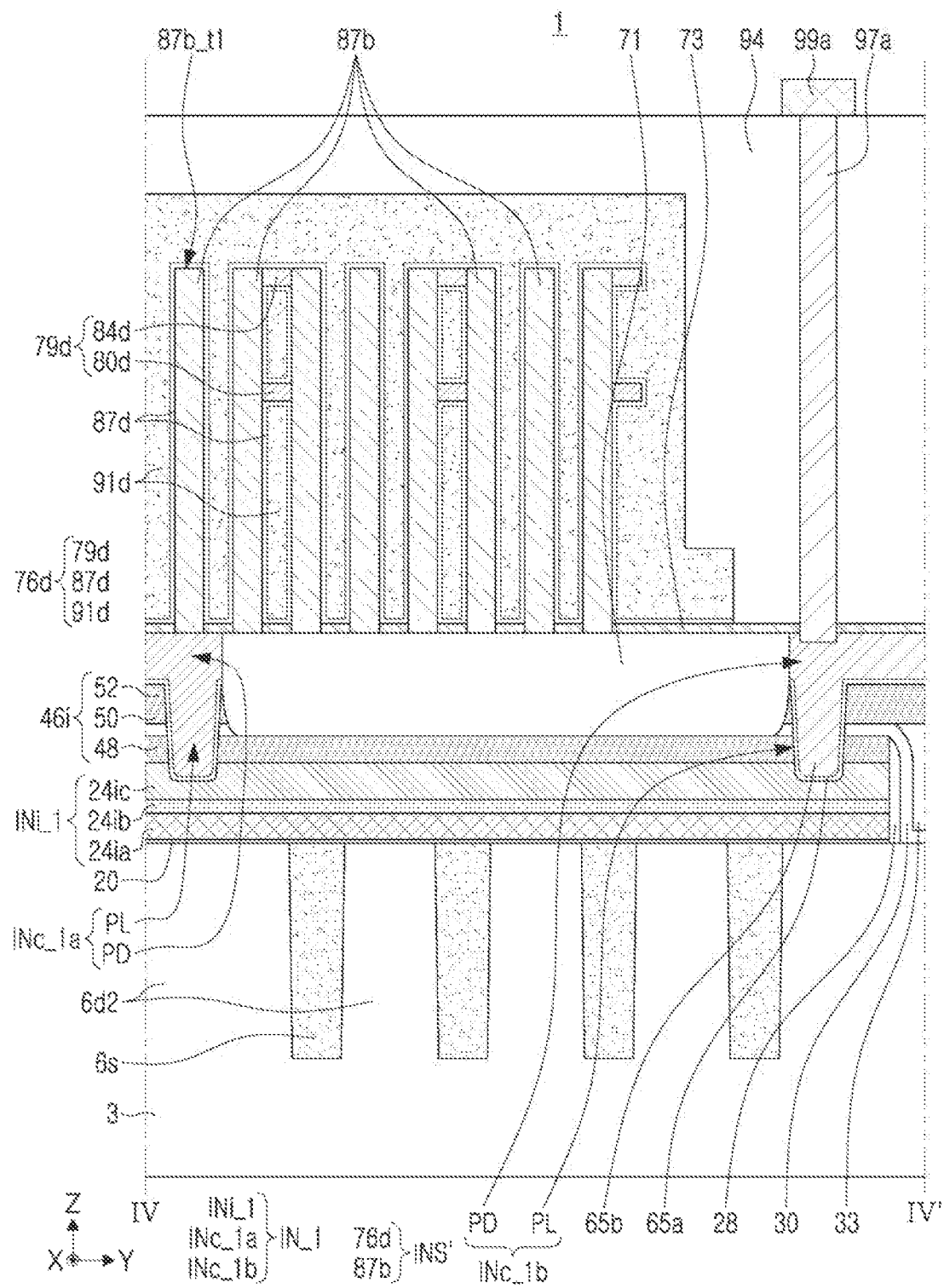
FIGS. 7A and 7B are diagrams illustrating a modified example of a semiconductor device according to an example embodiment of the present disclosure.
Figure 7B:
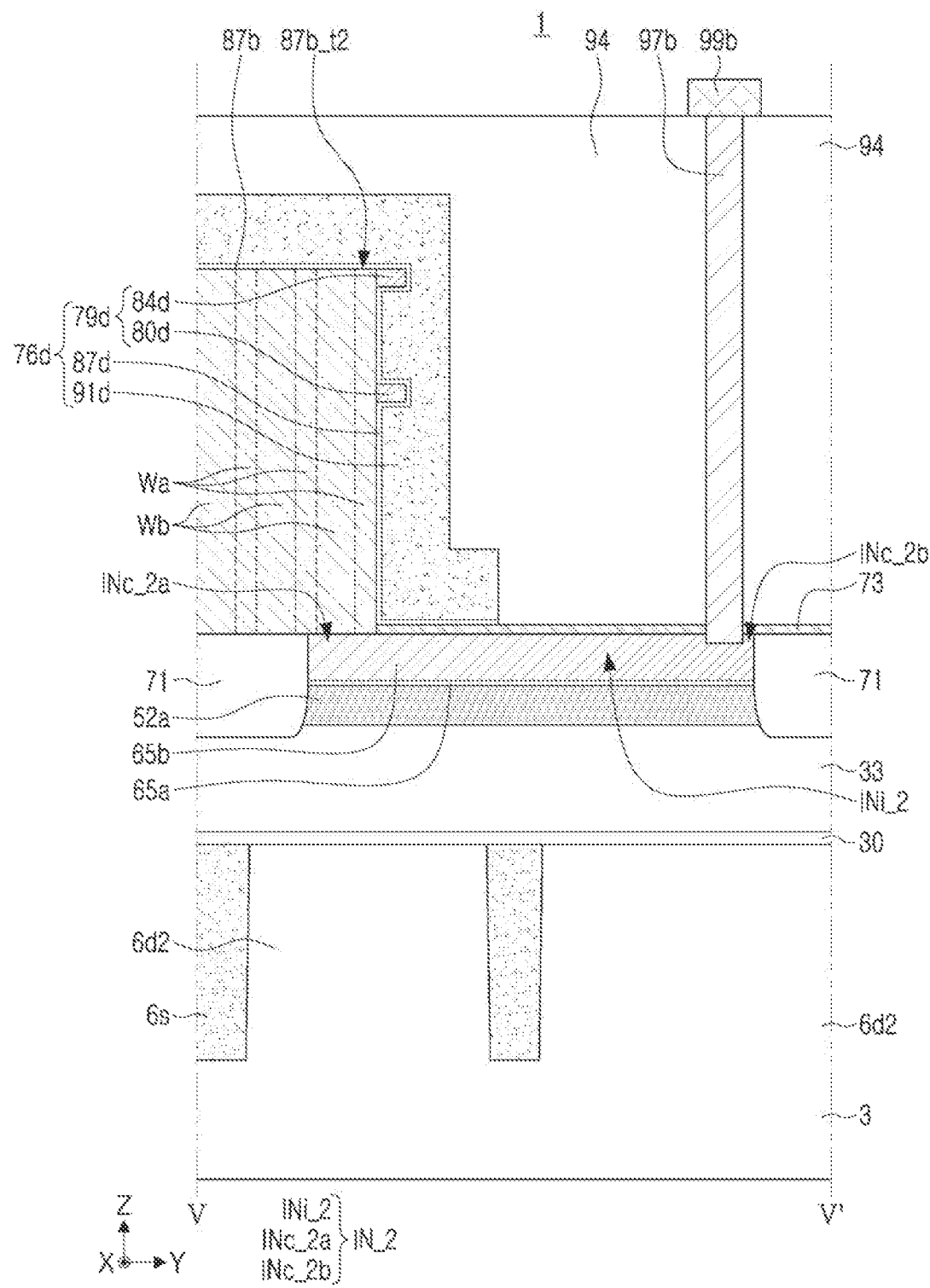

FIGS. 7A and 7B are diagrams illustrating a modified example of a semiconductor device according to an example embodiment of the present disclosure.

A modified example of the inductor structure INS in example embodiments will be described with reference to FIGS. 7A and 7B. FIG. 7A is a cross-sectional diagram taken along line IV-IV' in FIG. 2, and FIG. 7B is a cross-sectional diagram taken along line V-V' in FIG. 2.

In a modified example, referring to FIGS. 7A and 7B, the above-described insulating structure 76 may be replaced with a dummy structure 76d as in FIGS. 7A and 7B. Accordingly, the inductor structure INS' including the dummy structure 76d and the inductor conductive pattern 87b as described above may be provided.

The dummy structure 76d may include a dummy dielectric layer 87d, at least one dummy supporter layer 79d, and a dummy electrode 91d.

The dummy dielectric layer 87d may be formed of the same material as that of the dielectric layer 89a. The at least one dummy supporter layer 79d may be formed of the same material as that of the at least one supporter layer 79a. The dummy electrode 91d may be formed of the same material as that of the second electrode 91a.

The at least one dummy supporter layer 79d may include a lower dummy supporter layer 80d disposed at substantially the same level as a level of the lower supporter layer 80b, and an upper dummy supporter layer 84d disposed at substantially the same level as a level of the upper supporter layer 84b. The at least one dummy supporter layer 79d may have an opening.

The at least one dummy supporter layer 79d may contact a side surface of the inductor conductive pattern 87b and may prevent deformation or collapse of the inductor conductive pattern 87b.

The dummy electrode 91d may cover the at least one dummy supporter layer 79d and the inductor conductive pattern 87b. The dummy dielectric layer 87d may be disposed between the at least one dummy supporter layer 79d and the dummy electrode 91d and between the inductor conductive pattern 87b and the dummy electrode 91d. The upper interlayer insulating layer 94 may cover the dummy structure 76d.

The first and second contact plugs 97a and 97b may be spaced apart from the dummy structure 76d. For example, the first contact plug 97a may penetrate the upper interlayer insulating layer 94 and the upper etch stop layer 73, and may be electrically connected to the second contact pattern INc_1b of the first inductor connection structure IN_1, and the second contact plug 97b may penetrate the upper interlayer insulating layer 94 and the upper etch stop layer 73 and may be electrically connected to the second contact portion INc_2b of the second inductor connection structure 11\1_2.

Figure 8:
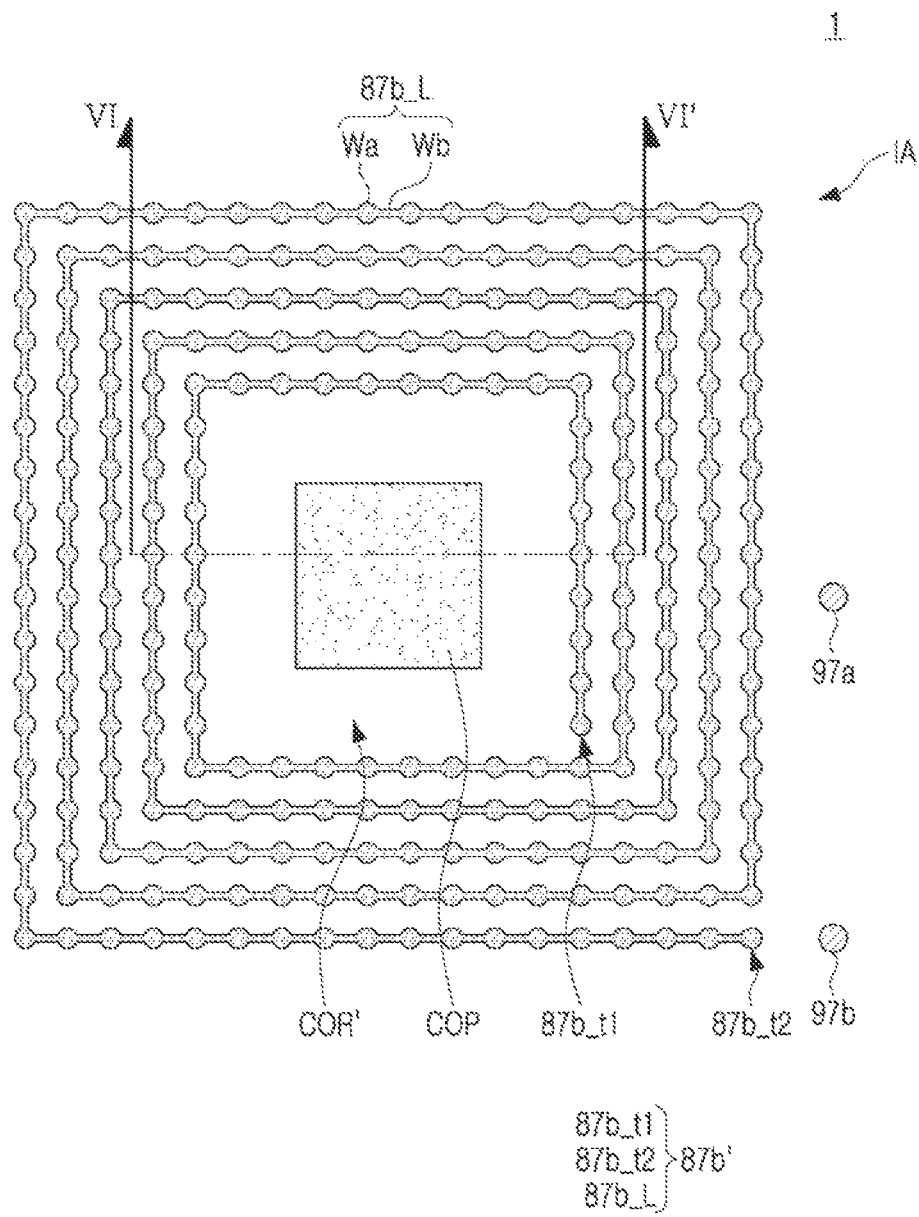
FIGS. 8 and 9 are diagrams illustrating a modified example of a semiconductor device according to an example embodiment of the present disclosure.
Figure 9:
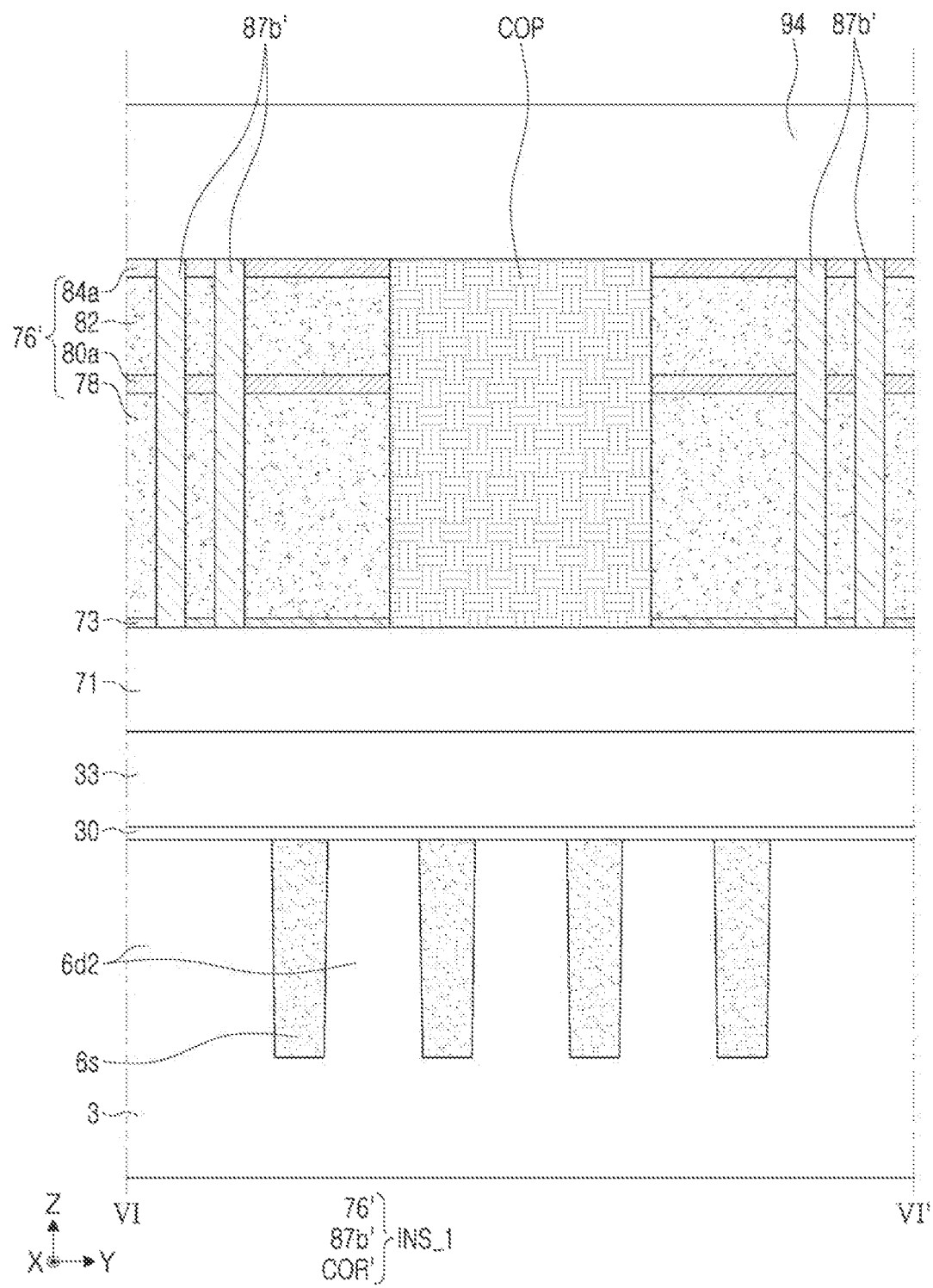

FIGS. 8 and 9 are diagrams illustrating a modified example of a semiconductor device according to an example embodiment of the present disclosure. A modified example of the inductor structure INS in example embodiments will be described with reference to FIGS. 8 and 9. FIG. 8 is a diagram illustrating a modified example of a semiconductor device according to an example embodiment, and FIG. 9 is a cross-sectional diagram taken along line VI-VI' in FIG. 8.

In the modified example, referring to FIGS. 8 and 9, the above-described inductor structure INS may be replaced with an inductor structure INS_1 as illustrated in FIGS. 8 and 9.

The inductor structure INS_1 may include an insulating structure 76', a spiral inductor conductive pattern 87b', and a core region COR' surrounded by the inductor conductive pattern 87b'.

The insulating structure 76' may have substantially the same structure as the insulating structure 76 (in FIGS. 4A and 4B) described above. The inductor conductive pattern 87b' may have substantially the same structure as the inductor conductive pattern 87b (in FIGS. 2, 4A, and 4B) described above.

The core region COR' may include a core pattern COP penetrating the insulating structure 76'. The core pattern COP may include a conductive material having high magnetic permeability, such as, for example, a metal material.

The core region COR' may be surrounded by the inductor conductive pattern 87b' and may be spaced apart from the inductor conductive pattern 87b'.

Inductance of the spiral inductor conductive pattern 87b' may change according to magnetic permeability of the core pattern COP. For example, when it is desired to increase inductance of the inductor conductive pattern 87b', the core pattern COP may be formed of a material having high magnetic permeability, such as, for example, a metal material.

Figure 10:
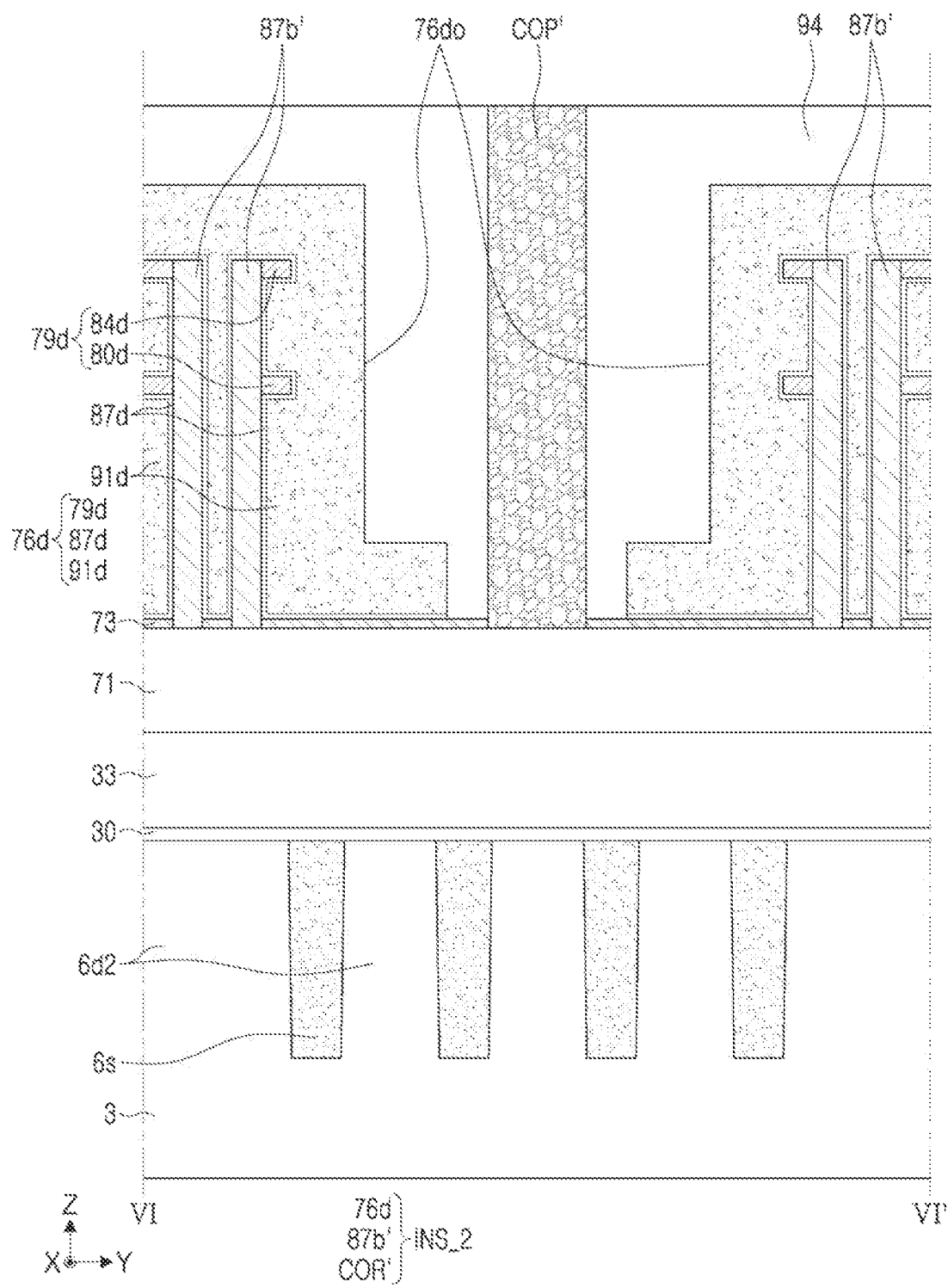
FIG. 10 is a cross-sectional diagram illustrating a modified example of a semiconductor device according to an example embodiment of the present disclosure.

FIG. 10 is a cross-sectional diagram illustrating a modified example of a semiconductor device according to an example embodiment of the present disclosure. A modified example of the inductor structure INS in example embodiments will be described with reference to FIG. 10. FIG. 10 is a cross-sectional diagram taken along line VI-VI' in FIG. 8.

In the modified example, referring to FIGS. 8 and 10, the insulating structure 76' in FIG. 9 may be replaced with the dummy structure 76d described with reference to FIGS. 7A and 7B. The dummy structure 76d may have an opening 76do in the core region COR'. The upper interlayer insulating layer 94 may cover the dummy structure 76d and may fill the opening 76do. The core pattern COP described with reference to FIG. 9 may be modified to a core pattern COP' penetrating the upper interlayer insulating layer 94. The core pattern COP' may include a conductive material. Accordingly, the core region COR' may include a portion of the dummy structure 76*d*, a portion of the upper interlayer insulating layer 94, and the core pattern COP'. Accordingly, the inductor structure INS_2 including the inductor conductive pattern 87*b*', the dummy structure 76*d*, and the core region COR' may be provided.

In example embodiments, in the inductor conductive pattern 87*b*, one line portion 87*b*_L may be disposed between the first end portion 87*b*_t1 and the second end portion 87*b*_t2, but an example embodiment thereof is not limited thereto. Hereinafter, various modifications of the inductor conductive pattern 87*b* will be described with reference to FIGS. 11 and 12.

Figure 11:
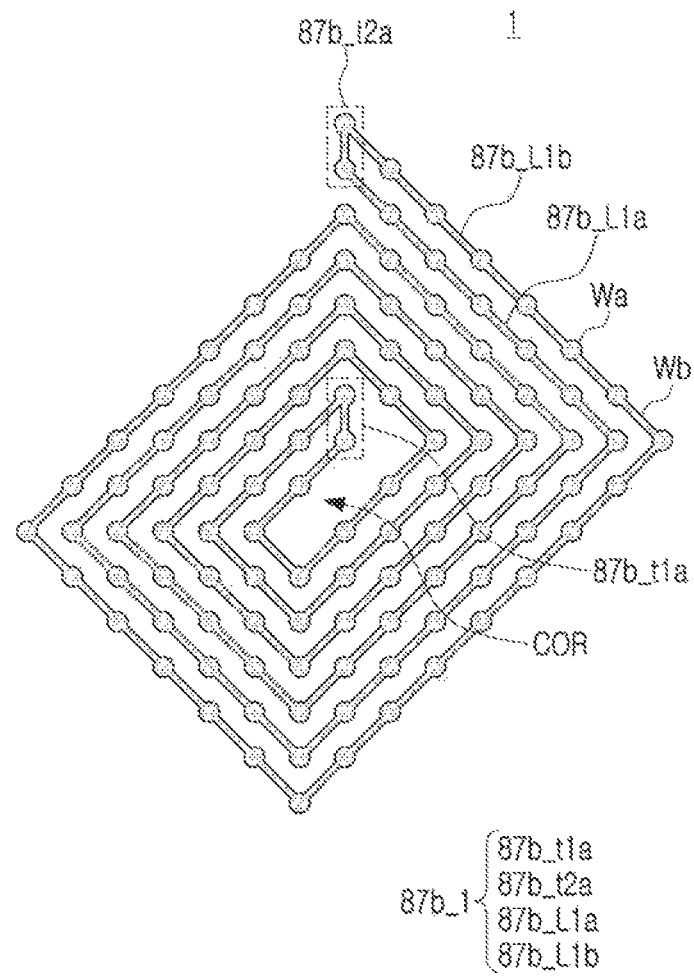
FIG. 11 is a diagram illustrating a modified example of a semiconductor device according to an example embodiment of the present disclosure.
Figure 12:
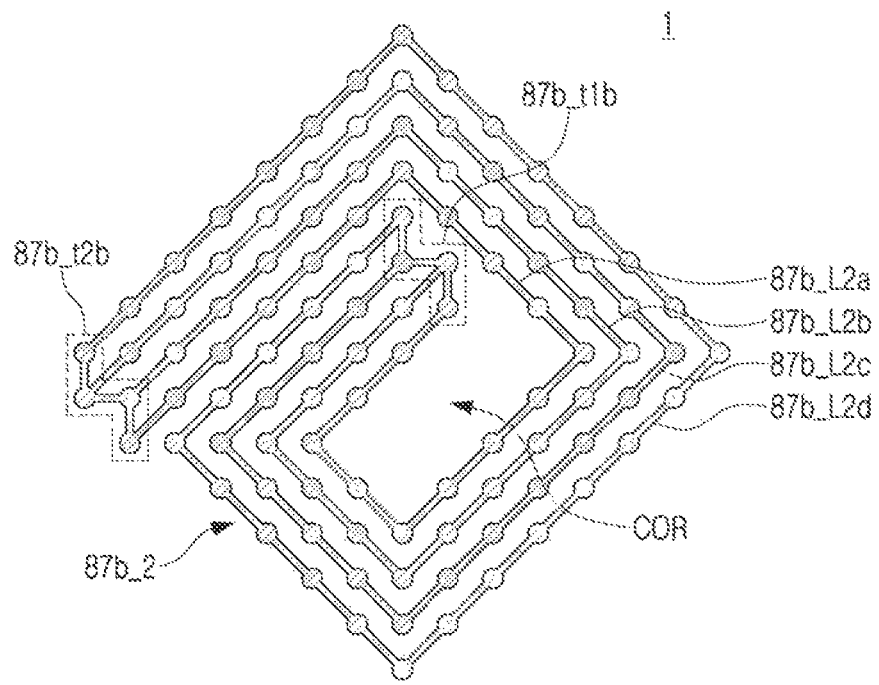
FIG. 12 is a diagram illustrating a modified example of a semiconductor device according to an example embodiment of the present disclosure.

FIG. 11 is a diagram illustrating a modified example of a semiconductor device according to an example embodiment of the present disclosure. FIG. 12 is a diagram illustrating a modified example of a semiconductor device according to an example embodiment of the present disclosure. FIGS. 11 and 12 are diagrams illustrating various modified examples of the inductor conductive pattern 87, viewed from the above.

In a modified example, referring to FIG. 11, the modified inductor conductive pattern 87*b*_1 may include a plurality of line portions 87*b*_L1*a* and 87*b*_L1*b* parallel to each other, a first end portion 87*b*_t1*a* connecting one end portions of the plurality of line portions 87*b*_L1*a* and 87*b*_L1*b* to each other, and a second end portion 87*b*_t2*a* connecting opposite end portions of the plurality of line portions 87*b*_L1*a* and 87*b*_L1*b*. The plurality of line portions 87*b*_L1*a* and 87*b*_L1*b* may include a first line portion 87*b*_L1*a* and a second line portion 87*b*_L1*b* parallel to each other.

In a modified example, referring to FIG. 12, the modified inductor conductive pattern 87*b*_2 may include a plurality of line portions 87*b*_L2*a*, 87*b*_L2*b*, 87*b*_L2*c*, 87*b*_L2*d* parallel to each other, a first end portion 87*b*_t1*b* connecting one end portions of the plurality of line portions 87*b*_L2*a*, 87*b*_L2*b*, 87*b*_L2*c*, and 87*b*_L2*d* to each other, and a second end portion 87*b* t2*b* connecting opposite end portions of the plurality of line portions 87*b*_L2*a*, 87*b*_L2*b*, 87*b*_L2*c*, and 87*b*_L2*d*. The plurality of line portions 87*b*_L2*a*, 87*b*_L2*b*, 87*b*_L2*c*, and 87*b*_L2*d* may include the first line portion 87*b*_L2*a*, the second line portion 87*b*_2*b*, the third line portion 87*b*_L2*c*, and the fourth line portion 87*b*_2*d* parallel to each other.

As in FIGS. 11 and 12 described above, the inductor conductive pattern may include a plurality of line portions disposed between opposite end portions, parallel to each other, and spaced apart from each other, but an example embodiment thereof is not limited thereto. For example, in an example embodiment, an inductor conductive pattern further including one or more connection patterns connecting a plurality of line portions disposed between opposite end portions to each other.

Figure 13:
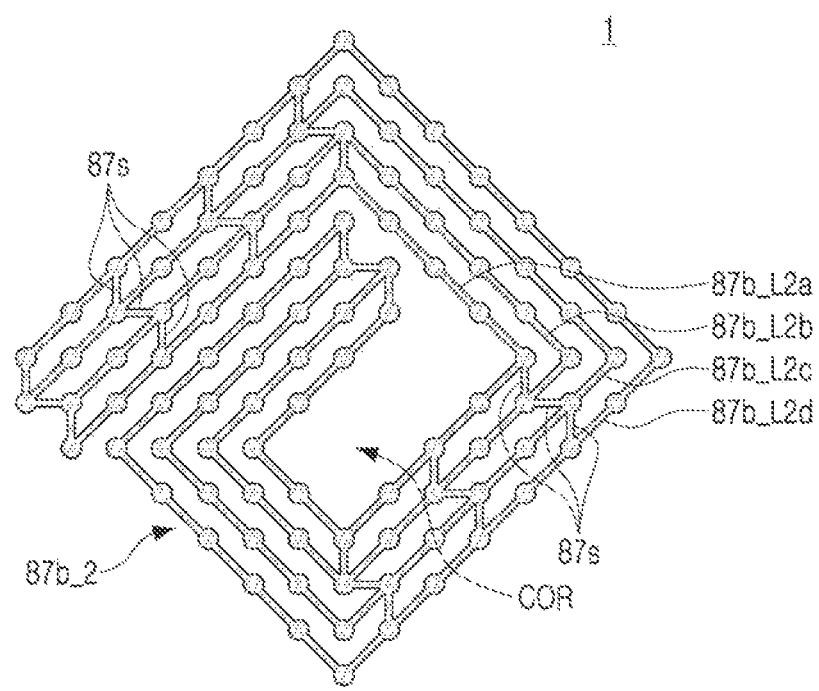
FIG. 13 is a diagram illustrating a modified example of a semiconductor device according to an example embodiment of the present disclosure.

FIG. 13 is a diagram illustrating a modified example of a semiconductor device according to an example embodiment of the present disclosure. An example of the inductor conductive pattern further including one or more connection patterns connecting the plurality of line portions to each other will be described with reference to FIG. 13. FIG. 13 is a diagram illustrating various modified examples of the inductor conductive pattern 87*b*_2 in FIG. 12, viewed from the above.

In the modified example, referring to FIG. 13, the inductor conductive pattern 87*b*_2 in FIG. 12 may further include one or more connection patterns 87*s* connecting the plurality of line portions 87*b*_L2*a*, 87*b*_L2*b*, 87*b*_L2*c*, and 87*b*_L2*d* to each other. A plurality of the one or more connection patterns 87*s* may be provided.

In example embodiments, in the spiral conductive pattern of the inductor, at least one line portion disposed between both end portions may be adjusted to adjust resistance. For example, the at least one line portion may be formed in a parallel structure as in FIGS. 11 and 12, that is, for example, may be formed as the plurality of line portions 87*b*_L1*a* and 87*b*_L1*b* parallel to each other. Resistance of the inductor conductive pattern may be adjusted according to the number of the plurality of line portions 87*b*_L1*a* and 87*b*_L1*b*. For example, when the number of the plurality of line portions 87*b*_L1*a* and 87*b*_L1*b* is two as illustrated in FIG. 11, resistance of the inductor conductive pattern may be reduced by ½, and when the number is four as illustrated in FIG. 12, resistance of the inductor conductive pattern may be reduced to ¼.

In example embodiments, in the spiral inductor conductive pattern, the at least one line portion may be formed in a parallel structure such that resistance RE may not increase excessively in terms of RE delay while increasing the number of windings to increase inductance. Furthermore, in the spiral conductive pattern, to optimize inductance and resistance, the number of the connection patterns 87*s* as illustrated in FIG. 13 may be adjusted while forming the at least one line portion in a parallel structure.

According to the above-described example embodiment, various inductor conductive patterns 87*b*, 87*b*', 87*ba*, 87*bb*, 87*b*_1, and 87*b*_2 which may be included in inductors may be provided. The semiconductor device 1 may include at least one of various inductor conductive patterns 87*b*, 87*b*', 87*ba*, 87*bb*, 87*b*_1, and 87*b*_2. Accordingly, the semiconductor device 1 having a higher operating speed may be provided, and the semiconductor device 1 which may meet requirements for diversified operating voltages may be provided.

Hereinafter, the inductor structure INS described in the aforementioned example embodiments may include an inductor conductive pattern 87*b* disposed at substantially the same level as a level of the first electrodes 87*a* of the data storage structure CAP, but an example embodiment thereof is not limited thereto. For example, the semiconductor device 1 according to an example embodiment may include an inductor structure including an inductor conductive pattern disposed at substantially the same level as a level of at least a portion of the word lines WL described above. Hereinafter, various examples of an inductor structure including an inductor pattern disposed at substantially the same level as a level of at least a portion of the word lines WL described above will be described.

Figure 14:
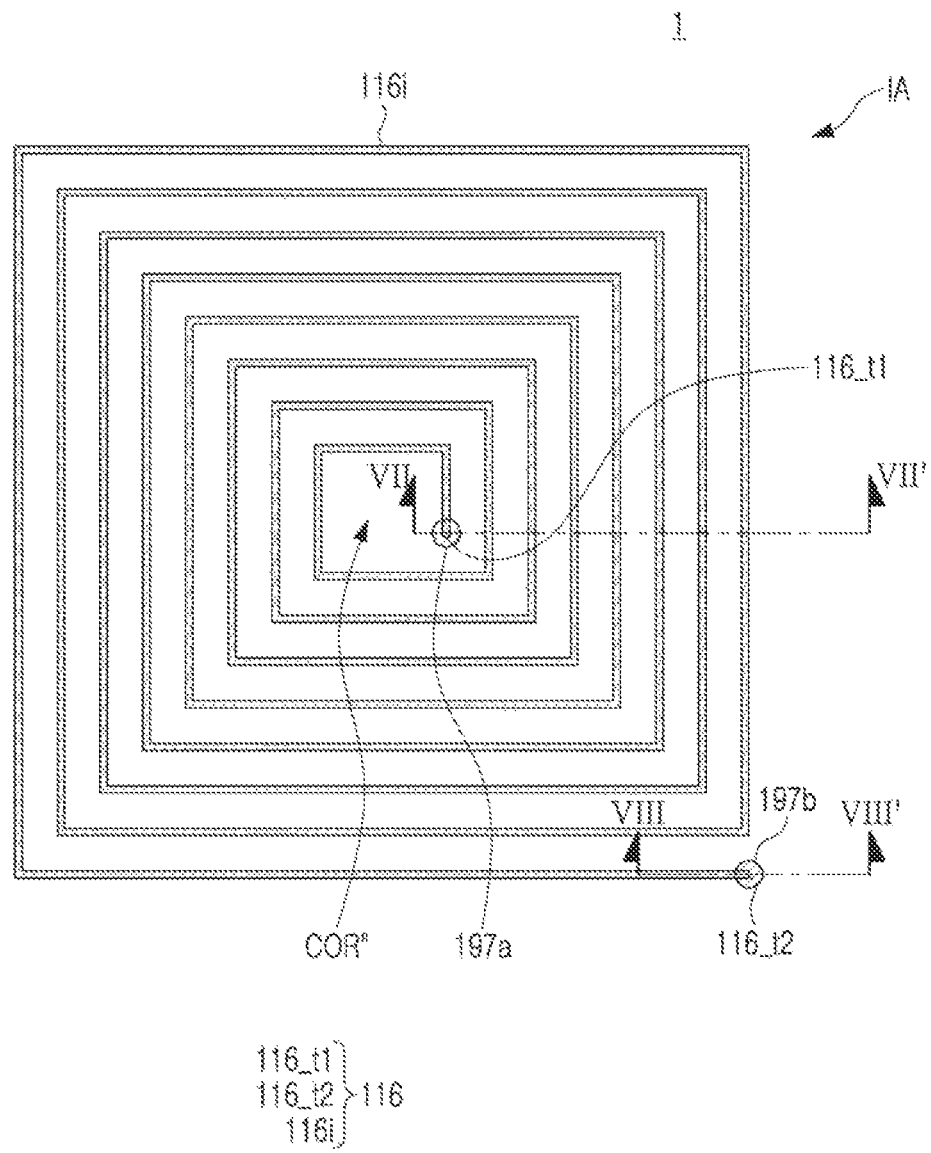
FIGS. 14, 15A, and 15B are diagrams illustrating a modified example of a semiconductor device according to an example embodiment of the present disclosure.
Figure 15A:
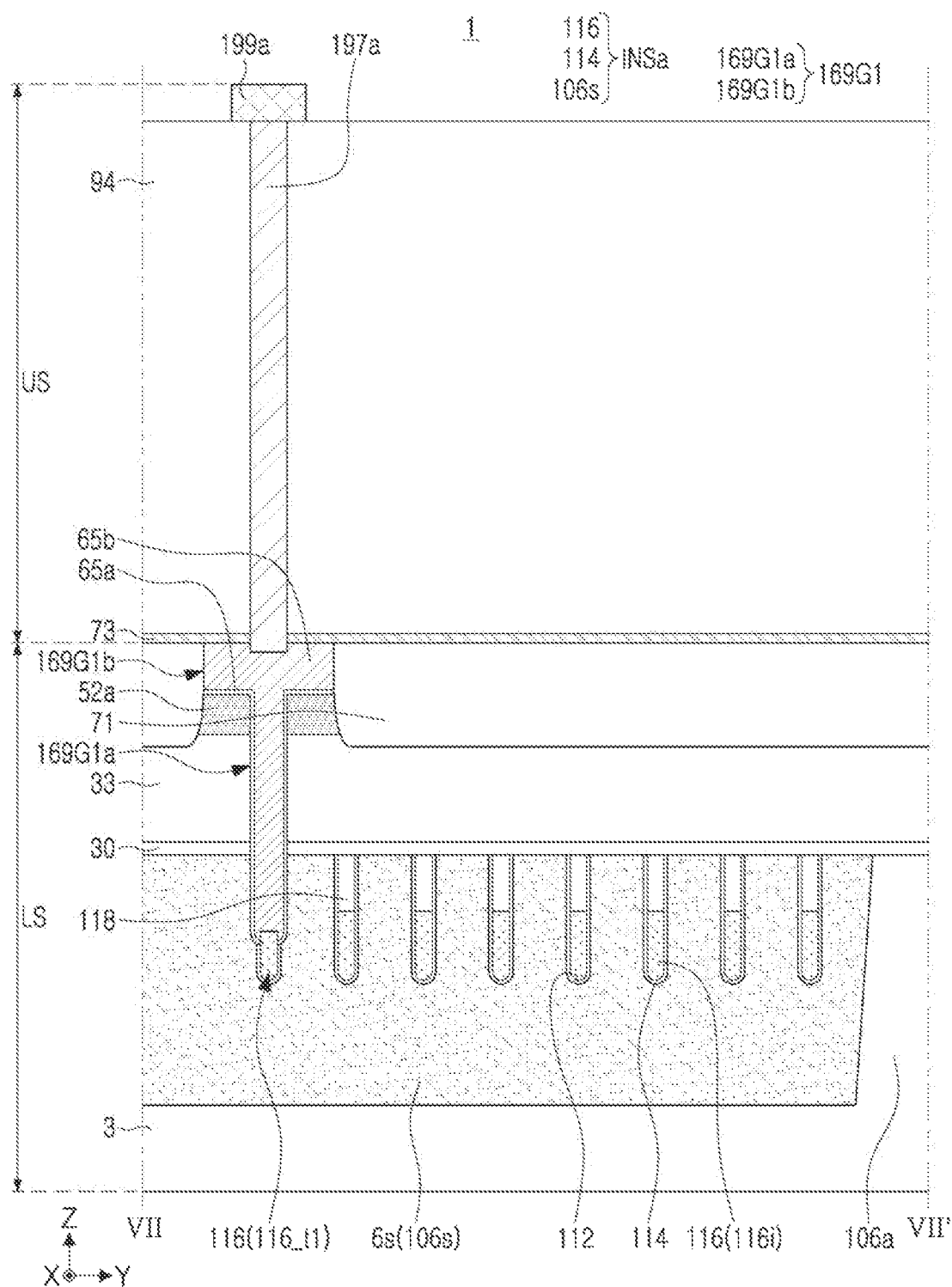
Figure 15B:
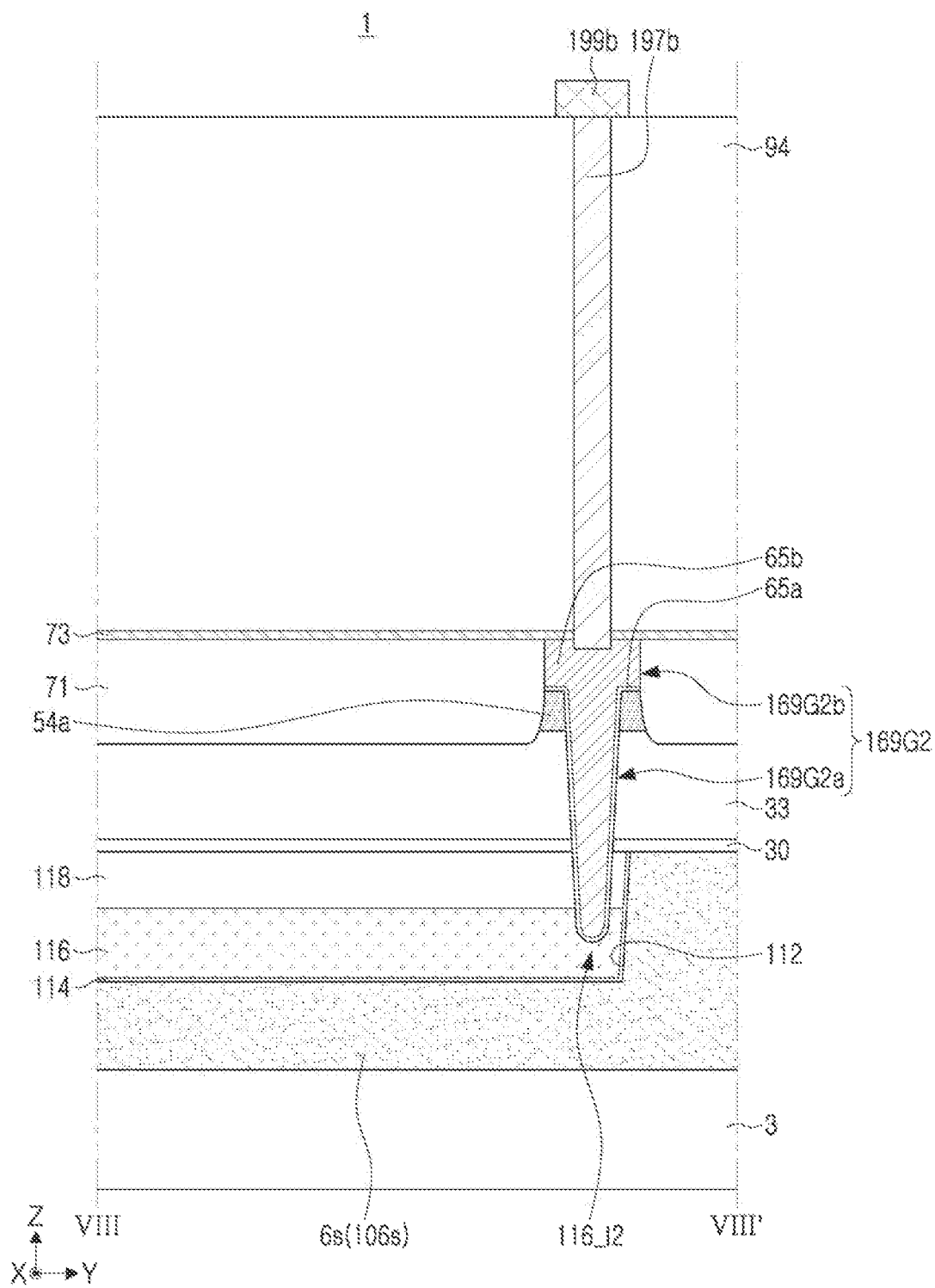

First, an example of an inductor structure including an inductor pattern disposed at substantially the same level as a level of at least a portion of the word lines WL described above will be described with reference to FIGS. 14, 15A, and 15B. FIGS. 14, 15A, and 15B are diagrams illustrating a modified example of a semiconductor device according to an example embodiment of the present disclosure. FIG. 14 is a diagram illustrating a modified example of a semiconductor device according to an example embodiment, FIG. 15A is a cross-sectional diagram taken along VII-VII' in FIG. 14, and FIG. 15B is a cross-sectional diagram taken along line VIII-VIII' in FIG. 14.

Referring to FIGS. 14, 15A, and 15B together with FIGS. 1, 3A, and 3B, in the inductor region IA, the lower structure LS may be formed in the same process as the process of forming the isolation region 6s on the substrate 3, and may include an inductor isolation region 106s defining the dummy active region 106a.

The lower structure LS may further include an inductor trench 112 disposed in the inductor isolation region 106s.

The lower structure LS may further include an inductor conductive pattern 116 partially filling the inductor trench 112, an inductor dielectric layer 114 disposed between the inductor conductive pattern 116 and the inductor trench 112, and an inductor capping pattern 118 disposed on the inductor conductive pattern 116 in the inductor trench 112.

The inductor dielectric layer 114 may be formed of the same material as that of the gate dielectric layer 14.

The inductor conductive pattern 116 may be formed of the same material as that of the word line WL. The inductor conductive pattern 116 may be disposed at substantially the same level as a level of at least a portion of each of the word lines WL.

The inductor conductive pattern 116 may include a first end portion 116_t1, a second end portion 116_t2, and at least one line portion 116i disposed between the first and second end portions 116_t1 and 116_t2. The at least one line portion 116i may extend from the first end portion 116_t1 to the second end portion 116t2.

The at least one line portion 116i may be configured as a line, but an example embodiment thereof is not limited thereto. For example, the at least one line portion 116i may include a plurality of line portions parallel to each other between the first and second end portions 116_t1 and 116_t2. For example, the at least one line portion 116i may be modified to at least one connection pattern 87s connecting two line portions parallel to each other as in FIG. 11, four line portions parallel to each other as in FIG. 12, line portions parallel to each other as in FIG. 13, and the line portions parallel to each other to each other, between the first and second end portions 116_t1 and 116t2.

The inductor capping pattern 118 may be formed of the same material as that of the gate capping pattern 18. The inductor capping pattern 118 may be formed at substantially the same level as a level of the gate capping pattern 18.

The inductor conductive pattern 116 may be a spiral surrounding the inductor core region COR". The inductor core region COR" surrounded by the inductor conductive pattern 116 may be configured as the inductor isolation region 106s.

The inductor conductive pattern 116, the inductor dielectric layer 114, and the inductor isolation region 106s may be included in an inductor structure INSa.

In the inductor region IA, the lower etch stop layer 30 described above may cover the inductor isolation region 106s, the dummy active region 106a, and the inductor capping pattern 118. Also, the interlayer insulating layer 33 and the upper capping insulating layer 52a of the lower structure LS described above may be stacked in order on the lower etch stop layer 30.

The lower structure LS may further include a first inductor connection structure 169G1 and a second inductor connection structure 169G2. Each of the first and second inductor connection structures 169G1 and 169G2 may have substantially the same structure as that of the gate connection structure 69G described with reference to FIG. 3A.

The first inductor connection structure 169G1 may include a plug portion 169G1a and a pad portion 169G1b disposed on the plug portion 169G1a, and the second inductor connection structure 169G2 may include a plug portion 169G2a and a pad portion 169G2b disposed on the plug portion 169G2a.

The upper etch stop layer 73 of the upper structure US may be provided on the dummy active region 106a, the inductor isolation region 106s and the inductor capping pattern 118 in the inductor region IA. The upper interlayer insulating layer 94 of the upper structure US may cover the upper etch stop layer 73 in the inductor region IA.

The upper structure US may include a first contact plug 197a penetrating the upper interlayer insulating layer 94 and the upper etch stop layer 73 and electrically connected to the pad portion 169G1b of the first inductor connection structure 169G1, a second contact plug 197b penetrating through the upper interlayer insulating layer 94 and the upper etch stop layer 73 and electrically connected to the pad portion 169G2b of the second inductor connection structure 169G2, a first wiring 199a disposed on the first contact plug 197a, and a second wiring 199b disposed on the second contact plug 197b.

Figure 16:
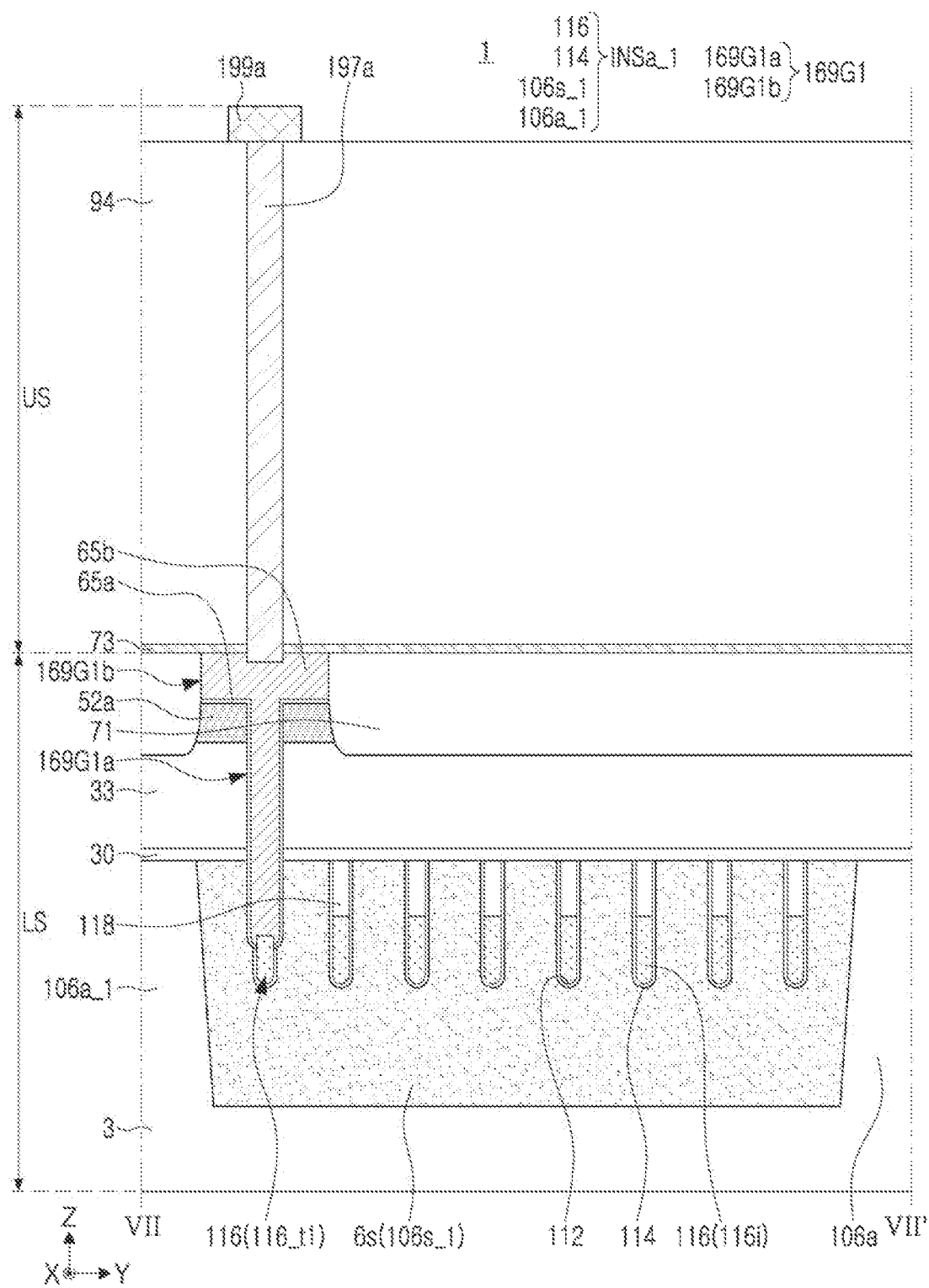
FIG. 16 is a cross-sectional diagram illustrating a modified example of a semiconductor device according to an example embodiment of the present disclosure.

FIG. 16 is a cross-sectional diagram illustrating a modified example of a semiconductor device according to an example embodiment of the present disclosure. Thereafter, a modified example of the inductor isolation region 106s described with reference to FIGS. 14, 15A, and 15B will be described with reference to FIG. 16. FIG. 16 is a cross-sectional diagram taken along line VII-VII' in FIG. 14.

In the modified example, referring to FIGS. 14 and 16, the inductor isolation region 106s described with reference to FIGS. 15A and 15B may be modified to an inductor isolation region 106s_1 defining the inductor core active region 106a_1 disposed in the inductor core region COR". Accordingly, the inductor core region COR" may include the inductor core active region 106a_1 and the inductor isolation region 106s_1. The inductor conductive pattern 116, the inductor dielectric layer 114, the inductor isolation region 106s_1, and the inductor core active region 106a_1 may be included in an inductor structure INSa_1.

Figure 17:
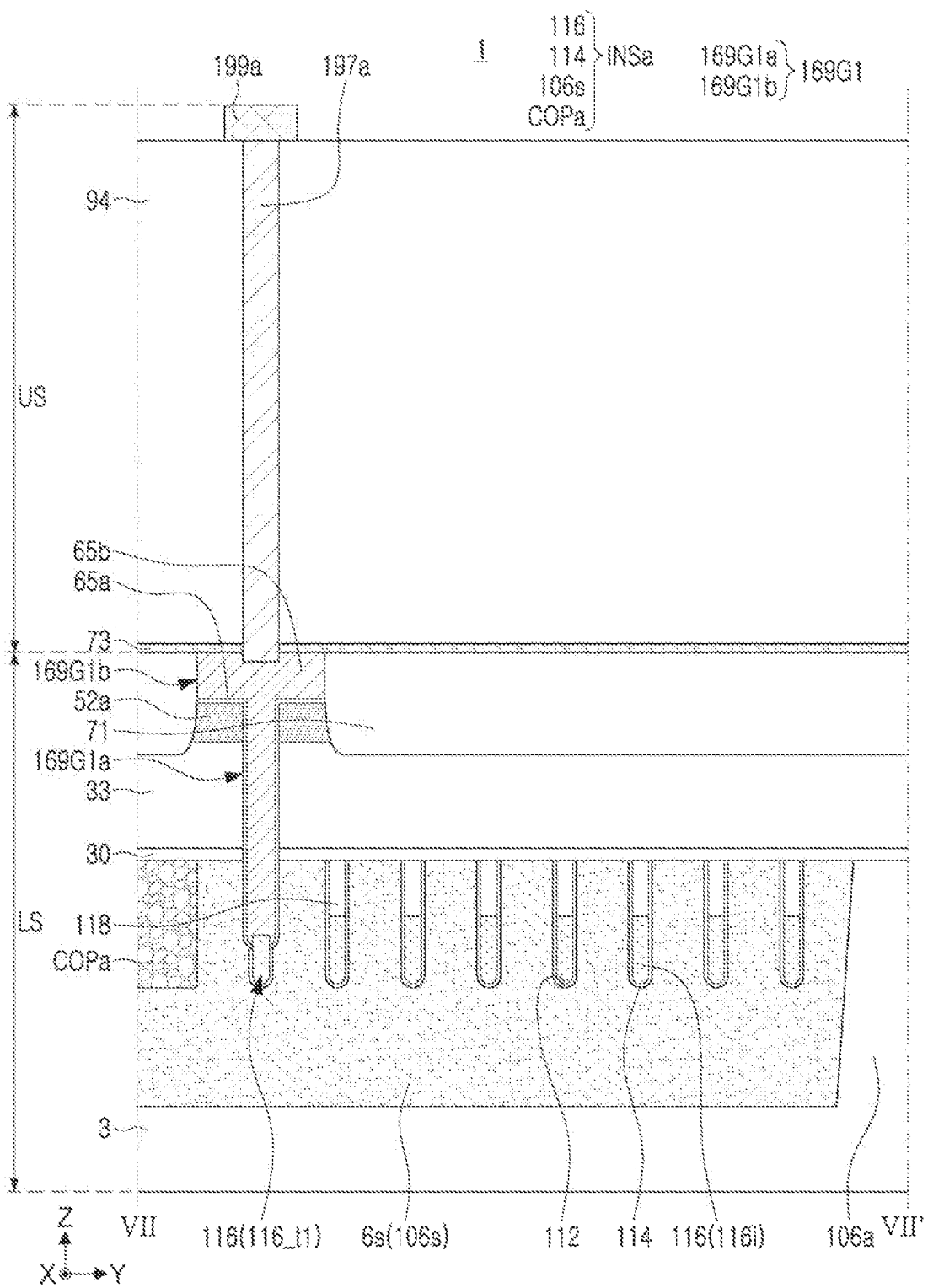
FIG. 17 is a cross-sectional diagram illustrating a modified example of a semiconductor device according to an example embodiment of the present disclosure.

FIG. 17 is a cross-sectional diagram illustrating a modified example of a semiconductor device according to an example embodiment of the present disclosure. A modified example of the inductor structure INSa described with reference to FIGS. 14, 15A, and 15B will be described with reference to FIG. 17. FIG. 17 is a cross-sectional diagram taken along line VII-VII' in FIG. 14.

In the modified example, referring to FIGS. 14 and 17, the inductor structure INSa described with reference to FIGS. 15A and 15B may further include an inductor core pattern COPa disposed in the inductor isolation region 106s disposed in the inductor core region COR".

Figure 18:
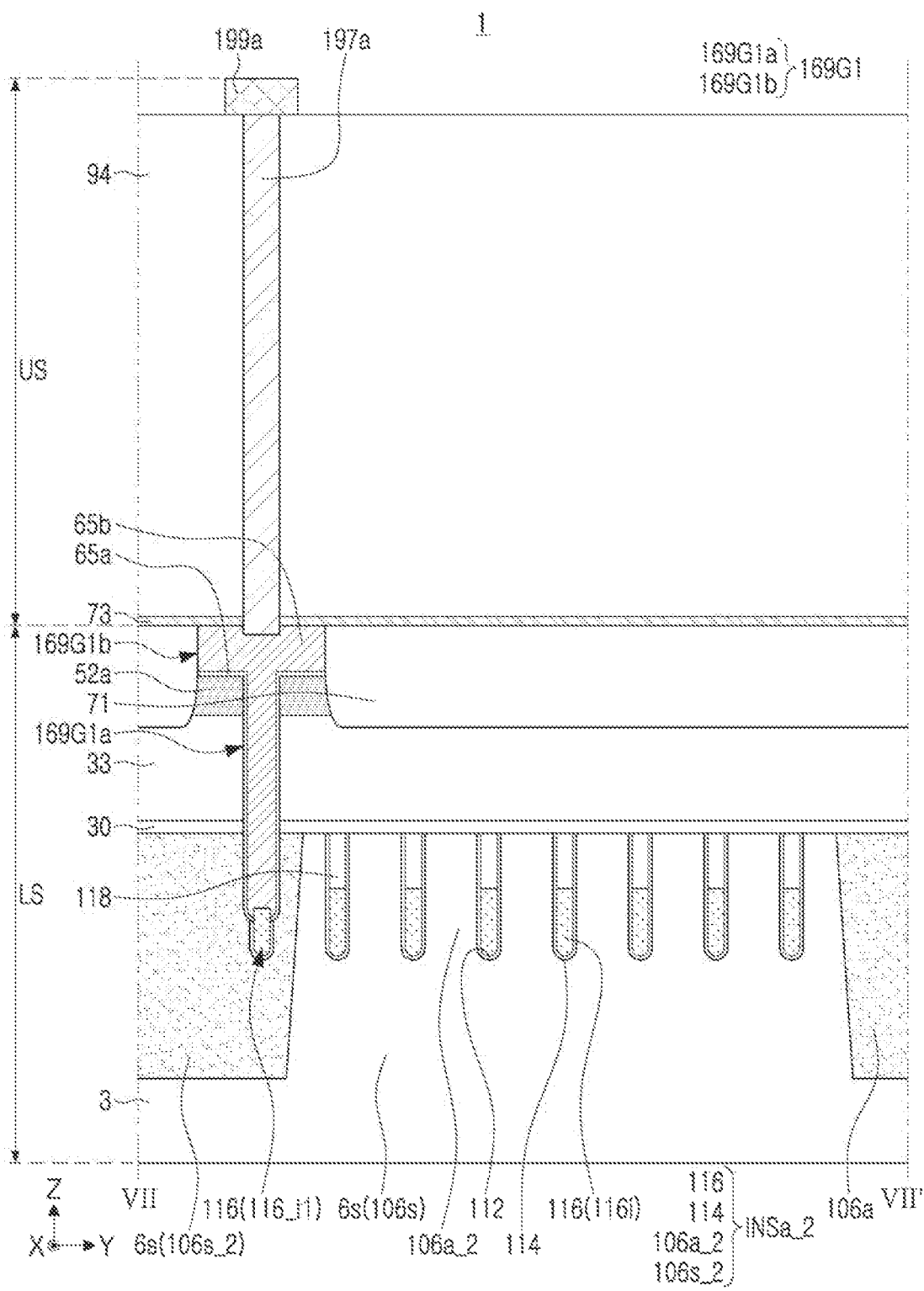
FIG. 18 is a cross-sectional diagram illustrating a modified example of a semiconductor device according to an example embodiment of the present disclosure.

FIG. 18 is a cross-sectional diagram illustrating a modified example of a semiconductor device according to an example embodiment of the present disclosure. A modified example of the inductor isolation region 106s described with reference to FIGS. 14, 15A, and 15B will be described with reference to FIG. 18. FIG. 18 is a cross-sectional diagram taken along line VII-VII' in FIG. 14.

In the modified example, referring to FIGS. 14 and 18, the inductor isolation region 106s described with reference to FIGS. 15A and 15B may be modified to an inductor isolation region 106s_2 defining an inductor core active region 106a_2 in which the at least one inductor line portion 116i is disposed.

The inductor trench 112 may be disposed in the inductor core active region 106a_2 and may extend into the inductor isolation region 106s_2.

In the inductor conductive pattern 116, the at least one line portion 116i may be disposed in the inductor core active region 106a_2, and the first end portion 116_t1 may be disposed in the inductor isolation region 106s_2.

The inductor conductive pattern 116, the inductor dielectric layer 114, the inductor isolation region 106s_2, and the inductor active region 106a_2 may be included in an inductor structure INSa_2.

Figure 19:
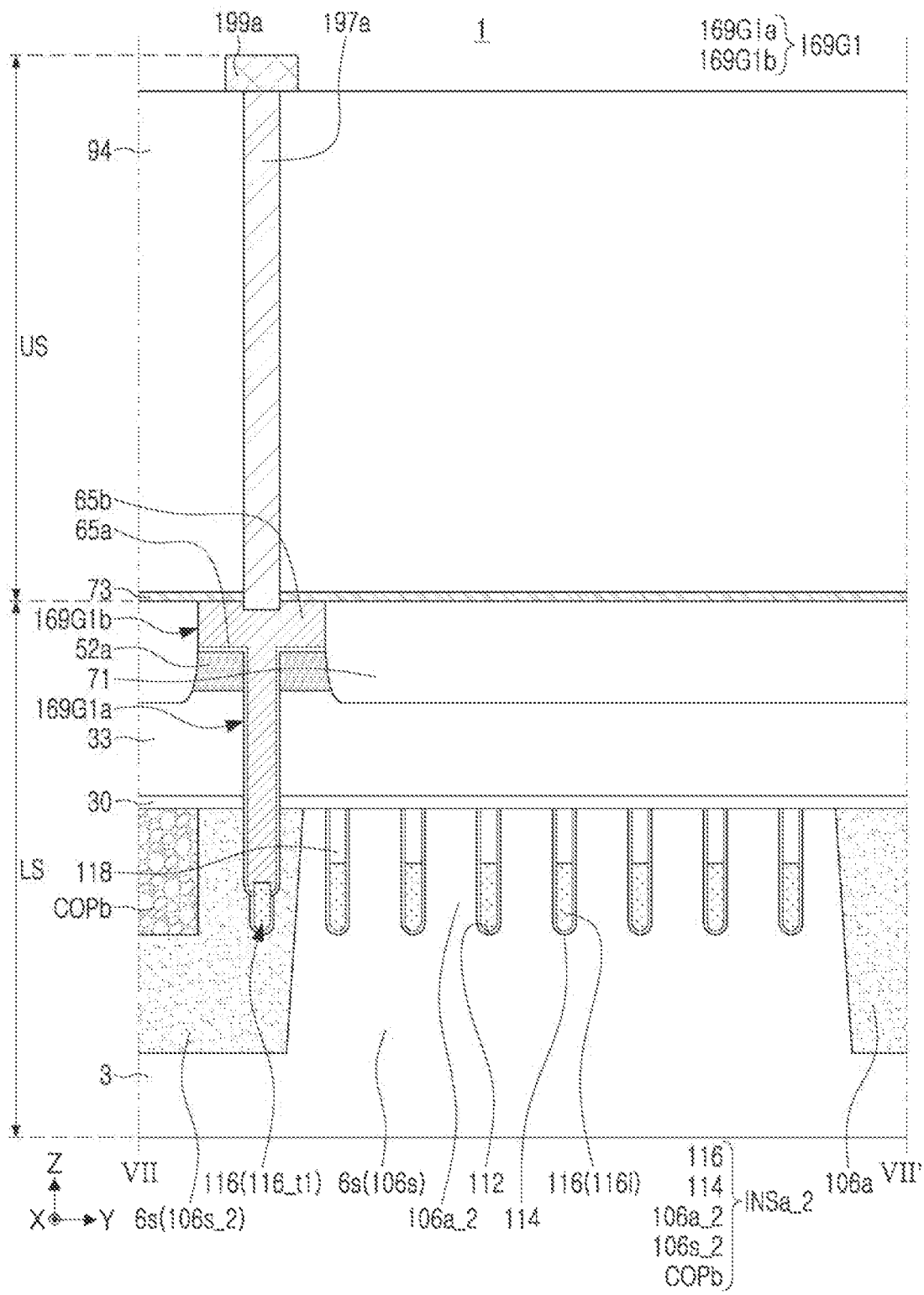
FIG. 19 is a cross-sectional diagram illustrating a modified example of a semiconductor device according to an example embodiment of the present disclosure.

FIG. 19 is a cross-sectional diagram illustrating a modified example of a semiconductor device according to an example embodiment of the present disclosure. Thereafter, a modified example of the inductor structure INSa_2 described with reference to FIG. 18 will be described with reference to FIG. 19. FIG. 19 is a cross-sectional diagram taken along line VII-VII' in FIG. 14.

In the modified example, referring to FIGS. 14 and 19, the inductor structure INSa_2 described with reference to FIG. 18 may further include an inductor core pattern COPb disposed in the inductor isolation region 106s_2 in the inductor core region COR".

Figure 20:
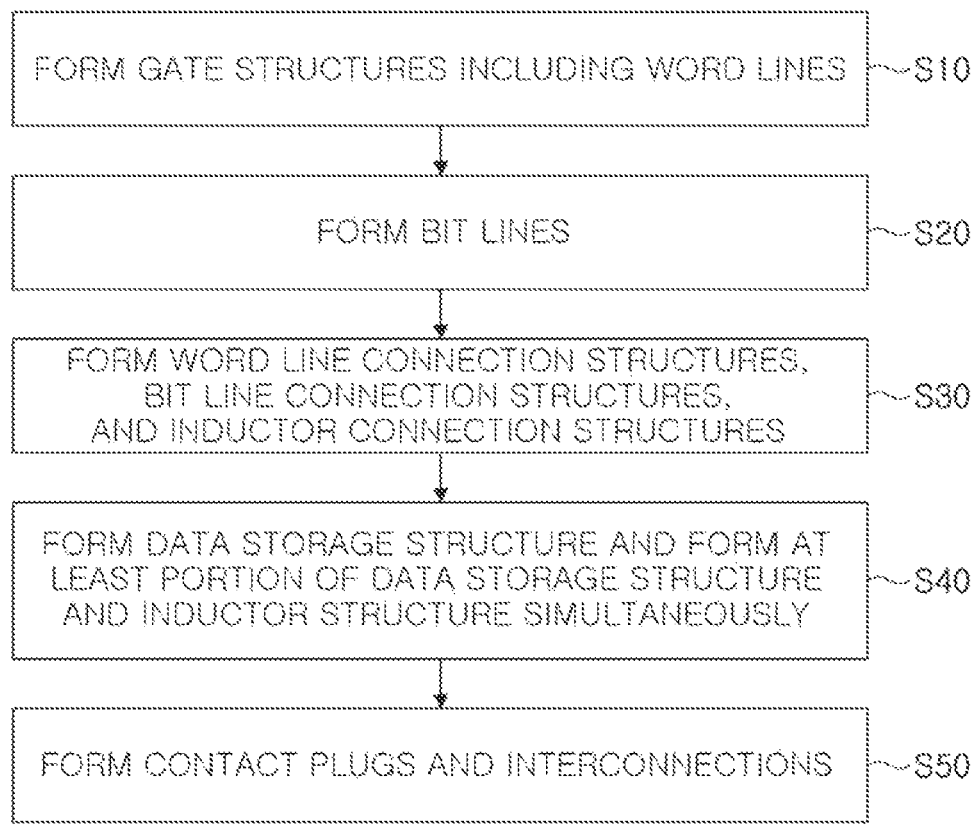
FIG. 20 is a flowchart illustrating processes of a method of manufacturing a semiconductor device according to an example embodiment of the present disclosure.

FIG. 20 is a flowchart illustrating processes of a method of manufacturing a semiconductor device according to an example embodiment of the present disclosure. An example of a method of forming a semiconductor device according to an example embodiment will be described with reference to FIG. 20 along with FIGS. 1 to 4B. FIG. 20 is a flowchart illustrating an example of a method of forming a semiconductor device according to an example embodiment. Hereinafter, a method of forming a portion of the components of the semiconductor device 1 described with reference to FIGS. 1 to 4B will be mainly described.

Referring to FIG. 20 together with FIGS. 1 to 4B, in operation S10, gate structures GS (in FIGS. 3A and 3B) including word lines WL may be formed.

The forming the gate structures GS (in FIGS. 3A and 3B) may include forming an isolation region 6s defining active regions 6a, 6d1, 6d2 on a substrate 3, forming gate trenches 12 (in FIGS. 3A and 3B) in the cell active regions 6a among the active regions 6a, 6d1, and 6d2 and the isolation region 6s in the memory cell array region MCA and the first extension region EA1, and filling each of the gate trenches 12 (in FIGS. 3A and 3B) with a gate dielectric layer 14 (in FIGS. 3A and 3B), a word line WL (in FIGS. 3A and 3B) and a gate capping pattern 18 (in FIGS. 3A and 3B).

In operation S20, bit lines BL (in FIGS. 1, 3A and 3B) may be formed. The forming the bit lines BL (in FIGS. 1, 3A and 3B) may include forming a buffer insulating layer 20, forming bit line contact plugs 38 penetrating through the buffer insulating layer 20 in the memory cell array region MCA and the second extension region EA2, and forming the bit lines BL on the buffer insulating layer 20 and the bit line contact plugs 38. As illustrated in FIGS. 3A and 3B, each of the bit lines BL may include a first conductive layer 40, a second conductive layer 42, and a third conductive layer 44 stacked in order.

In an example, the forming the bit line contact plugs 38 may include forming the conductive layer for forming the first conductive layer 40, forming a contact hole penetrating the conductive layer and the buffer insulating layer 20, and filling the contact hole with a conductive material.

In another example embodiment, the forming the bit line contact plugs 38 may include forming a contact hole penetrating through the buffer insulating layer 20 and filling the contact hole with a conductive material, before forming a conductive layer for forming the first conductive layer 40.

Bit line capping patterns 46 (in FIGS. 3A and 3B) for patterning the bit lines BL may be formed on the bit lines BL.

In operation S30, word line connection structures 69G (in FIG. 3A), bit line connection structures 69B (in FIG. 3B), and inductor connection structures Ni_ and IN_2 (in FIGS. 4A and 4B) may be formed.

A first inductor connection structure IN_1 (in FIG. 4A) of the inductor connection structures IN_1 and IN_2 (in FIGS. 4A and 4B) may include a connection pattern INi_1 formed simultaneously with the bit lines BL, and contact patterns (INc_1a and INc_1b in FIG. 4A) disposed on the connection pattern INi_1.

The word line connection structures 69G (in FIG. 3A), the bit line connection structures 69B (in FIG. 3B), the contact patterns INc_1a and INc_1b (in FIG. 4A), and the second inductor connection structure 11\1_2 (in FIG. 4B) of the inductor connection structures IN_1 and IN_2 (in FIGS. 4A and 4B) may be simultaneously formed.

In operation S40, along with forming a data storage structure CAP (in FIGS. 3A and 3B), an inductor structure INS (in FIGS. 4A and 4B) may be formed simultaneously with at least a portion of the data storage structure CAP (in FIGS. 3A and 3B).

The forming the data storage structure CAP (in FIGS. 3A and 3B) and the inductor structure INS (in FIGS. 4A and 4B) may include forming an insulating structure on a substrate including the memory cell array region MCA and the inductor region IA, forming holes penetrating the insulating structure in the memory cell array region MCA and the inductor region IA, forming conductive patterns filling the holes, forming an opening 790 (in FIG. 1) by partially etching the insulating structure, forming openings exposing side surfaces of conductive patterns filling the holes in the memory cell array region MCA by removing a portion of the insulating layers of the insulating structure, and forming a dielectric layer 89a and a second electrode 91a in order in the memory cell array region MCA.

The conductive patterns filling the holes in the memory cell array region MCA may be first electrodes 87a (in FIGS. 3A and 3B) of the data storage structure CAP (in FIGS. 3A and 3B), the conductive patterns filling the holes in the inductor region IA may be the inductor conductive patterns 87b of the inductor structure INS (in FIGS. 4A and 4B), and the insulating structure in the inductor region IA may be the insulating structure 76 (in FIGS. 4A and 4B) in the inductor region IA. Subsequently, in operation S50, contact plugs 97a and 97b (in FIGS. 4A and 4B) and interconnections 99a and 99b (in FIGS. 4A and 4B) may be formed.

In another example embodiment, while forming an opening for exposing side surfaces of conductive patterns filling the holes in the memory cell array region MCA by removing a portion of insulating layers of the insulating structure, an opening for exposing side surfaces of the conductive patterns filling the holes in the inductor area Lk may be formed together, and while forming the dielectric layer 89a (in FIGS. 3A and 3B) and the second electrode 91a (in FIGS. 3A and 3B) in order, a dummy dielectric layer 87d (in FIGS. 7A and 7B) and a dummy electrode 91d (in FIGS. 7A and 7B) may be formed in order in the inductor region IA.

The inductor conductive pattern 87b (in FIGS. 4A and 4B) may be formed simultaneously with at least a portion of the data storage structure CAP, that is, for example, the first electrodes 87a in FIGS. 3A and 3B. Accordingly, since the inductor conductive pattern 87b (in FIGS. 4A and 4B) may be formed without a process for forming the inductor conductive pattern 87b (in FIGS. 4A and 4B), productivity may increase.

Figure 21:
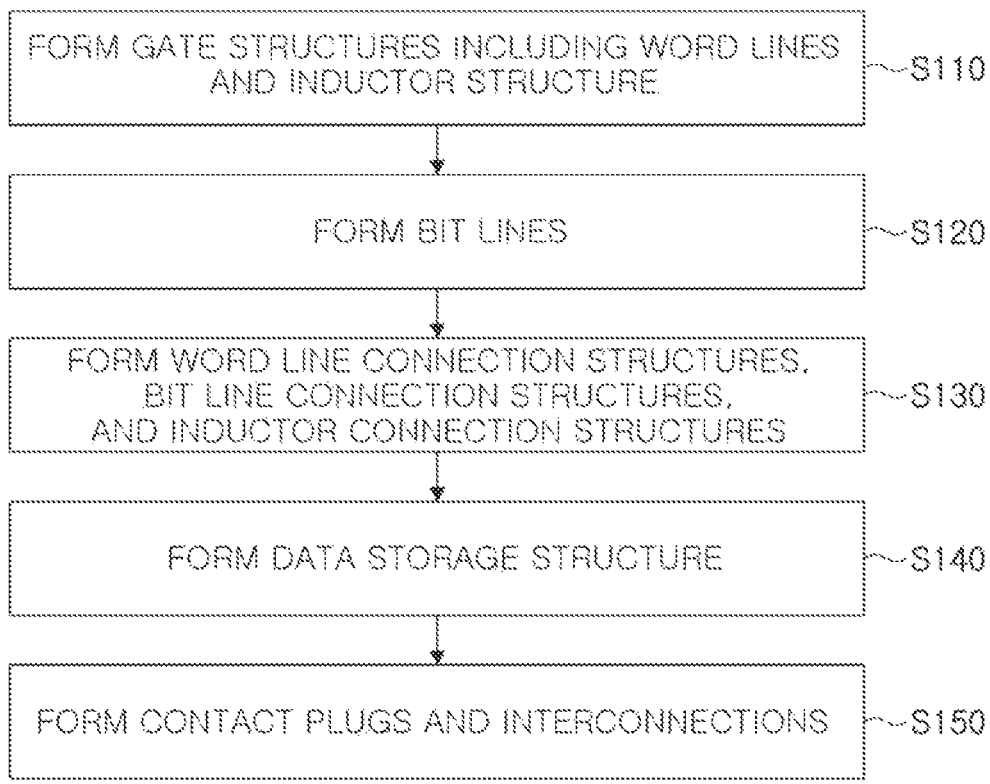
FIG. 21 is a flowchart illustrating a modified example of a method of manufacturing a semiconductor device according to an example embodiment of the present disclosure.

FIG. 21 is a flowchart illustrating a modified example of a method of manufacturing a semiconductor device according to an example embodiment of the present disclosure. In the description below, another example of a method of forming a semiconductor device according to an example embodiment will be described with reference to FIG. 21, along with FIGS. 1, 3A, 3B, 14, 15A, and 15B. FIG. 21 is a flowchart illustrating another example of a method of forming a semiconductor device according to an example embodiment. Hereinafter, a method of forming a portion of the components of the semiconductor device 1 described with reference to FIGS. 1, 3A, 3B, 14, 15A, and 15B will be mainly described.

Referring to FIG. 21 along with FIGS. 1, 3A, 3B, 14, 15A, and 15B, in operation S110, gate structures GS (in FIGS. 3A and 3B) including word lines WL and an inductor structure INSa (in FIGS. 15A and 15B) may be formed.

The forming the gate structures GS (in FIGS. 3A and 3B) and inductor structure INSa (in FIGS. 15A and 15B) may include forming device isolation regions 6s and 106s defining active regions 6a and 106a on the substrate 3, forming gate trenches 12 (in FIGS. 3A and 3B) in the cell active regions 6a and the isolation region 6s of the active regions 6a and 106a in the memory cell array region MCA and the first extension region EA1, and simultaneously forming an inductor trench 112 (in FIGS. 15A and 15B) in the isolation region 106s in the inductor region IA, forming a gate dielectric layer 14 (in FIGS. 3A and 3B) filling each of the gate trenches 12 (in FIGS. 3A and 3B), a word line WL (in FIGS. 3A and 3B) and the gate capping pattern 18 (in FIGS. 3A and 13B) in the memory cell array region MCA and the first extension region EA1, and forming an inductor dielectric layer 114 (in FIGS. 15A and 15B), an inductor conductive pattern 116 (in FIGS. 15A and 15B) and an inductor capping pattern 118 (FIGS. 15A and 15B) filling the inductor trench 112 (in FIGS. 15A and 15B) in the inductor region IA.

By the same method as described with reference to FIG. 20, in operation S120, bit lines BL (in FIGS. 1, 3A, and 3B) may be formed. In operation S130, word line connection structures 69G (in FIG. 3A), bit line connection structures 69B (in FIG. 3B), and inductor connection structures 169G1 and 169G2 (in FIGS. 15A and 15B) may be formed. The word line connection structures 69G (in FIG. 3A), the bit line connection structures 69B (in FIG. 3B), and the inductor connection structures 169G1 and 169G2 (in FIGS. 15A and 15B) may be simultaneously formed.

In operation S140, a data storage structure CAP (in FIGS. 3A and 3B) may be formed. The forming the data storage structure CAP (in FIGS. 3A and 3B) may include forming an insulating structure on a substrate including a memory cell array region MCA and an inductor region IA, forming holes penetrating through the insulating structure in the memory cell array region MCA, forming first electrodes 87a (in FIGS. 3A and 3B) filling the holes, forming an opening 790 (in FIG. 1) by etching a portion of the insulating structure, forming an opening for exposing side surfaces of the first electrodes (87a in FIGS. 3A and 3B) by removing a portion of insulating layers of the insulating structure, and forming a dielectric layer 89a and the second electrode 91a in order in the memory cell array region MCA. Subsequently, in operation S150, contact plugs 197a and 197b (in FIGS. 15A and 15B) and interconnections 199a and 199b (in FIGS. 15A and 15B) may be formed.

The inductor conductive pattern 116 (in FIGS. 14, 15A, and 16B) may be formed simultaneously with the gate electrode, that is, the word line WL. Accordingly, since the inductor conductive pattern 116 (in FIGS. 14, 15A, and 16B) may be formed without a process for forming the inductor conductive pattern 116 (in FIGS. 14, 15A, and 16B), productivity of the semiconductor device 1 may improve.

According to example embodiments, a semiconductor device including an inductor conductive pattern and a data storage structure may be provided. Such an inductor conductive pattern may be a spiral inductor. The inductor conductive pattern may be formed simultaneously with the gate electrode or may be simultaneously with at least a portion of the data storage structure. Accordingly, since the inductor conductive pattern may be formed without a process for forming the inductor conductive pattern, productivity of the semiconductor device may increase.

Also, since the inductor conductive pattern may be disposed in the dummy region, a semiconductor device including the inductor conductive pattern without increasing the size of the semiconductor device may be provided.

Each of the embodiments provided in the above description is not excluded from being associated with one or more features of another example or another embodiment also provided herein or not provided herein but consistent with the disclosure.

While the example embodiments have been illustrated and described above, it will be configured as apparent to those skilled in the art that modified examples and variations could be made without departing from the scope of the present disclosure as defined by the appended claims.

What is claimed is:

1. A semiconductor device, comprising:
   a lower structure;
   a data storage structure on the lower structure; and
   an inductor structure on the lower structure,
   wherein the data storage structure comprises:
      first electrodes extending in a vertical direction perpendicular to an upper surface of the lower structure;
      a second electrode provided on the first electrodes; and
      a dielectric layer between the first electrodes and the second electrode, and
   wherein the inductor structure comprises an inductor conductive pattern at a level that is substantially the same as a level of the first electrodes.

2. The semiconductor device of claim 1, wherein each of the first electrodes has a columnar shape extending in the vertical direction.

3. The semiconductor device of claim 1, further comprising:
   at least one supporter layer between the first electrodes, the at least one supporter layer comprising an opening and contacting the first electrodes;
   wherein the second electrode is provided on the first electrodes and the at least one supporter layer, and
   wherein the dielectric layer is between the at least one supporter layer and the second electrode.

4. The semiconductor device of claim 3, wherein the at least one supporter layer further comprises a lower supporter layer and an upper supporter layer on a level higher than a level of the lower supporter layer.

5. The semiconductor device of claim 3, wherein the inductor structure further comprises an insulating structure contacting a side surface of the inductor conductive pattern,
   wherein the insulating structure comprises a plurality of insulating layers stacked in order,
   wherein the plurality of insulating layers comprises at least one first insulating layer comprising a first material and at least one second insulating layer comprising a second material different from the first material, and wherein the at least one first insulating layer comprises a material that is the same as a material of the at least one supporter layer.

6. The semiconductor device of claim 3, wherein the inductor structure further comprises a dummy structure contacting a side surface of the inductor conductive pattern,
wherein the dummy structure comprises a dummy dielectric layer contacting the side surface of the inductor conductive pattern, and a dummy electrode provided on the dummy dielectric layer,
wherein the dummy dielectric layer comprises a material that is the same as a material of the dielectric layer, and
wherein the dummy electrode comprises a material that is the same as a material of the second electrode.

7. The semiconductor device of claim 6, wherein the dummy structure further comprises at least one insulating layer at a level that is the same as a level of the at least one supporter layer, the at least one insulating layer comprising a material that is the same as a material of the at least one supporter layer, and the at least one insulating layer contacting
the inductor conductive pattern, and
wherein the dummy dielectric layer is provided on the inductor conductive pattern and the at least one insulating layer.

8. The semiconductor device of claim 1, wherein the inductor conductive pattern comprises a material that is the same as a material of the first electrodes.

9. The semiconductor device of claim 1, wherein the inductor conductive pattern comprises a spiral inductor.

10. A semiconductor device, comprising:
a cell transistor comprising a first source/drain region, a second source/drain region, and a gate electrode;
a bit line connected to the first source/drain region;
a bit line connection structure comprising a bit line contact portion contacting the bit line and a bit line wiring portion on the bit line contact portion;
a contact structure connected to the second source/drain region;
a data storage structure comprising a first electrode contacting the contact structure, a second electrode provided on the first electrode, and a dielectric layer between the first electrode and the second electrode;
an inductor conductive pattern comprising a first end portion, a second end portion, and at least one line portion extending from the first end portion to the second end portion;
a first inductor connection structure connected to the first end portion of the inductor conductive pattern; and
a second inductor connection structure connected to the second end portion of the inductor conductive pattern,
wherein the bit line wiring portion is on a level higher than a level of the bit line and is on a level lower than a level of the data storage structure,
wherein the inductor conductive pattern is at a level different from a level of the bit line wiring portion,
wherein the first inductor connection structure comprises a first contact portion at a level that is the same as a level of the bit line wiring portion, and
wherein the second inductor connection structure comprises a second contact portion at a level that is the same as a level of the bit line wiring portion.

11. The semiconductor device of claim 10, wherein the inductor conductive pattern is at a level that is substantially the same as a level of the first electrode.

12. The semiconductor device of claim 10, wherein at least a portion of the inductor conductive pattern is at a level that is the same as a level of at least a portion of the gate electrode.

13. The semiconductor device of claim 10, further comprising:
a metallic inductor core pattern,
wherein the inductor conductive pattern comprises a spiral inductor at least partially surrounding the metallic inductor core pattern.

14. The semiconductor device of claim 10, wherein, in the inductor conductive pattern, the at least one line portion comprises a plurality of line portions parallel to each other.

15. The semiconductor device of claim 14, wherein the inductor conductive pattern further comprises at least one connection portion connecting the plurality of line portions to each other between the plurality of line portions.

16. A semiconductor device, comprising:
a substrate;
a memory cell array region,
an inductor region,
a first extension region on a first side of the memory cell array region,
a second extension region on a second side of the memory cell array region;
active regions on the substrate;
an isolation region on the substrate and defining the active regions;
a gate trench in the memory cell array region and the first extension region, intersecting a cell active region in the memory cell array region among the active regions, and extending into the isolation region;
a gate structure in the gate trench and comprising a gate electrode;
a bit line in the memory cell array region and the second extension region, intersecting the cell active region in a direction intersecting the gate structure on a level higher than a level of the gate structure, and connected to a first source/drain region in the cell active region;
a contact structure on a second source/drain region in the cell active region and connected to the second source/drain region;
a data storage structure comprising:
a first electrode contacting the contact structure,
a second electrode provided on the first electrode, and
a dielectric layer in the memory cell array region and between the first electrode and the second electrode;
a gate connection structure connected to the gate electrode in the first extension region and comprising a gate contact portion contacting the gate electrode on the gate electrode and a gate wiring portion on the gate contact portion;
a bit line connection structure in the second extension region and comprising a bit line contact portion contacting the bit line on the bit line and a bit line wiring portion on the bit line contact portion;
an inductor conductive pattern in the inductor region and comprising:
a first end portion,
a second end portion, and
at least one line portion extending from the first end portion to the second end portion;
a first inductor connection structure in the inductor region and connected to the first end portion of the inductor conductive pattern; and a second inductor connection structure in the inductor region and connected to the second end portion of the inductor conductive pattern, wherein the bit line wiring portion and the gate wiring portion are on a level higher than a level of the bit line and are on a level lower than a level of the data storage structure, wherein the inductor conductive pattern is at a level different from a level of the bit line wiring portion, wherein the first inductor connection structure comprises a first contact portion at a level that is the same as a level of the bit line wiring portion, and wherein the second inductor connection structure comprises a second contact portion at a level that is the same as a level of the bit line wiring portion.

17. The semiconductor device of claim 16, wherein the inductor conductive pattern is at a level that is substantially the same as a level of the first electrode.

18. The semiconductor device of claim 16, wherein at least a portion of the inductor conductive pattern is at a level that is the same as a level of at least a portion of the gate electrode.

19. The semiconductor device of claim 18, wherein the active regions comprise an inductor active region in the inductor region, wherein the isolation region comprises an inductor isolation region in the inductor region, and wherein the inductor conductive pattern is in the inductor active region and in an inductor trench in the inductor isolation region.

20. The semiconductor device of claim 18, wherein the isolation region comprises an inductor isolation region in the inductor region, and wherein the inductor conductive pattern is in an inductor trench in the inductor isolation region.

* * * * *